(12) United States Patent
Gee et al.

(10) Patent No.: US 10,115,819 B2
(45) Date of Patent: Oct. 30, 2018

(54) RECESSED HIGH VOLTAGE METAL OXIDE SEMICONDUCTOR TRANSISTOR FOR RRAM CELL

(71) Applicant: Crossbar, Inc., Santa Clara, CA (US)

(72) Inventors: Harry Yue Gee, Milpitas, CA (US); Tanmay Kumar, Pleasanton, CA (US); Natividad Vasquez, Jr., San Francisco, CA (US); Steven Patrick Maxwell, Sunnyvale, CA (US); Sundar Narayanan, Cupertino, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 14/726,071

(22) Filed: May 29, 2015

(65) Prior Publication Data

US 2016/0351625 A1    Dec. 1, 2016

(51) Int. Cl.
*H01L 29/423*  (2006.01)
*H01L 27/24*  (2006.01)
(Continued)

(52) U.S. Cl.
CPC ...... *H01L 29/7827* (2013.01); *H01L 27/2436* (2013.01); *H01L 29/4236* (2013.01);
(Continued)

(58) Field of Classification Search
CPC ............. H01L 27/0727; H01L 27/2454; H01L 27/2436; H01L 29/665; H01L 29/4236;
(Continued)

(56) References Cited

U.S. PATENT DOCUMENTS 6,849,891 B1   2/2005   Hsu et al.
6,855,975 B2   2/2005   Gilton
(Continued)

FOREIGN PATENT DOCUMENTS

CN   1506972 A   6/2004
CN   1961378 A   5/2007
(Continued)

OTHER PUBLICATIONS

Wolf, S., "Silicon Processing for the VLSI Era, Volum 3—The Submicron MOSFET", Lattice Press, Sunset Beach, CA, 1995 (ISBN 0-961672-5-3), section 4.8, pp. 200-201.*
(Continued)

*Primary Examiner* — Jami V Miller
(74) *Attorney, Agent, or Firm* — Amin, Turocy & Watson, LLP

(57) ABSTRACT

A recessed high voltage metal oxide semiconductor (MOS) transistor is provided for use in a two-terminal memory cell. The two-terminal memory cell can include a resistive switching device connected to the recessed MOS transistor. The recessed MOS transistor provides for an increased channel length relative to the transistor size in comparison to a traditional MOS transistor. This allows for a decreased memory cell size while maintaining comparable electrical parameters (threshold voltage, channel length, and leakage) than would otherwise be possible. The recessed MOS transistor can be made as either a NMOS or PMOS device using n-type or p-type materials respectively, where the channel, or inversion layer, is formed by electrons (NMOS) or holes (PMOS) between the source and drain in the transistor.

21 Claims, 13 Drawing Sheets

(51) Int. Cl.
*H01L 29/78* (2006.01)
*H01L 45/00* (2006.01)
*H01L 29/66* (2006.01)

(52) U.S. Cl.
CPC .. *H01L 29/42372* (2013.01); *H01L 29/42376* (2013.01); *H01L 29/6659* (2013.01); *H01L 29/66621* (2013.01); *H01L 45/16* (2013.01); *H01L 29/665* (2013.01)

(58) Field of Classification Search
CPC ........... H01L 29/7827; H01L 29/42356; H01L 29/1037; H01L 29/6659; H01L 29/66621; H01L 45/16; H01L 27/2409; H01L 27/2427; H01L 29/42372; H01L 29/42376; H01L 45/04; H01L 29/00; H01L 27/24; G11C 13/0002; G11C 13/0021; G11C 13/004
USPC .......... 257/330, 1–5, E29.002; 438/102–104
See application file for complete search history.

(56) References Cited

U.S. PATENT DOCUMENTS

| | | | |
|---|---|---|---|
| 7,176,530 B1 * | 2/2007 | Bulucea | H01L 21/823807 257/369 |
| 7,187,577 B1 | 3/2007 | Wang et al. | |
| 7,274,064 B2 | 9/2007 | Bertin et al. | |
| 7,280,390 B2 | 10/2007 | Kostylev et al. | |
| 7,368,752 B2 * | 5/2008 | Luyken | H01L 27/10823 257/68 |
| 7,388,775 B2 | 6/2008 | Bedeschi et al. | |
| 7,579,612 B2 | 8/2009 | Tang et al. | |
| 7,704,788 B2 | 4/2010 | Youn et al. | |
| 7,786,464 B2 | 8/2010 | Nirschl et al. | |
| 7,791,060 B2 | 9/2010 | Aochi et al. | |
| 7,829,875 B2 | 11/2010 | Scheuerlein | |
| 7,830,698 B2 | 11/2010 | Chen et al. | |
| 7,835,174 B2 | 11/2010 | Tokiwa | |
| 7,859,884 B2 | 12/2010 | Scheuerlein | |
| 7,881,097 B2 | 2/2011 | Hosomi et al. | |
| 7,897,953 B2 | 3/2011 | Liu | |
| 7,920,412 B2 | 4/2011 | Hosotani et al. | |
| 7,924,138 B2 | 4/2011 | Kinoshita et al. | |
| 7,961,506 B2 | 6/2011 | Liu | |
| 8,004,882 B2 | 8/2011 | Katti et al. | |
| 8,018,760 B2 | 9/2011 | Muraoka et al. | |
| 8,045,364 B2 | 10/2011 | Schloss et al. | |
| 8,067,815 B2 | 11/2011 | Chien et al. | |
| 8,102,698 B2 | 1/2012 | Scheuerlein | |
| 8,139,392 B2 | 3/2012 | Hosoi | |
| 8,164,948 B2 | 4/2012 | Katti et al. | |
| 8,218,350 B2 | 7/2012 | Kozicki | |
| 8,278,170 B2 | 10/2012 | Lee et al. | |
| 8,320,160 B2 | 11/2012 | Nazarian | |
| 8,329,537 B2 | 12/2012 | Kim et al. | |
| 8,351,241 B2 | 1/2013 | Lu et al. | |
| 8,369,139 B2 | 2/2013 | Liu et al. | |
| 8,411,485 B2 | 4/2013 | Nazarian et al. | |
| 8,502,185 B2 | 8/2013 | Lu et al. | |
| 8,587,050 B2 | 11/2013 | Ohba | |
| 8,659,933 B2 | 2/2014 | Jo | |
| 8,735,247 B2 | 5/2014 | Yoo et al. | |
| 8,767,441 B2 | 7/2014 | Lu et al. | |
| 8,993,397 B2 | 3/2015 | Herner | |
| 9,023,719 B2 | 5/2015 | Pachamuthu et al. | |
| 9,305,624 B2 | 4/2016 | Shepard | |
| 2001/0007447 A1 | 7/2001 | Tanaka et al. | |
| 2004/0114413 A1 | 6/2004 | Parkinson et al. | |
| 2004/0170040 A1 | 9/2004 | Rinerson et al. | |
| 2006/0097238 A1 | 5/2006 | Breuil et al. | |
| 2006/0231910 A1 | 10/2006 | Hsieh et al. | |
| 2007/0268744 A1 | 11/2007 | Taguchi | |
| 2008/0192531 A1 | 8/2008 | Tamura et al. | |
| 2008/0291719 A1 | 11/2008 | Fackenthal et al. | |
| 2009/0014707 A1 | 1/2009 | Lu et al. | |
| 2009/0027976 A1 | 1/2009 | Brewer et al. | |
| 2009/0122592 A1 | 5/2009 | Tokiwa | |
| 2009/0231910 A1 | 9/2009 | Liu et al. | |
| 2009/0315092 A1 * | 12/2009 | Mikasa | H01L 21/84 257/303 |
| 2010/0008127 A1 | 1/2010 | Muraoka et al. | |
| 2010/0124093 A1 | 5/2010 | Shiga et al. | |
| 2010/0157656 A1 | 6/2010 | Tsuchida | |
| 2010/0176367 A1 | 7/2010 | Liu | |
| 2010/0220523 A1 | 9/2010 | Modha et al. | |
| 2010/0237314 A1 | 9/2010 | Tsukamoto et al. | |
| 2010/0243983 A1 | 9/2010 | Chiang et al. | |
| 2010/0252909 A1 | 10/2010 | Nakanishi et al. | |
| 2011/0033967 A1 | 2/2011 | Lutz et al. | |
| 2011/0089391 A1 | 4/2011 | Mihnea et al. | |
| 2011/0149639 A1 | 6/2011 | Carter et al. | |
| 2011/0175087 A1 | 7/2011 | Yamazaki et al. | |
| 2011/0305065 A1 | 12/2011 | Nazarian et al. | |
| 2011/0310656 A1 | 12/2011 | Kreupl et al. | |
| 2011/0317470 A1 | 12/2011 | Lu et al. | |
| 2012/0007035 A1 | 1/2012 | Jo et al. | |
| 2012/0025160 A1 | 2/2012 | Sonehara | |
| 2012/0044751 A1 | 2/2012 | Wang et al. | |
| 2012/0112156 A1 | 5/2012 | Park et al. | |
| 2012/0122290 A1 | 5/2012 | Nagashima | |
| 2012/0132971 A1 * | 5/2012 | Mikasa | H01L 27/10814 257/296 |
| 2012/0176831 A1 | 7/2012 | Xiao et al. | |
| 2012/0187410 A1 * | 7/2012 | Yamazaki | H01L 27/0688 257/66 |
| 2012/0211719 A1 | 8/2012 | Haimoto et al. | |
| 2012/0211722 A1 | 8/2012 | Kellam et al. | |
| 2012/0236650 A1 | 9/2012 | Nazarian | |
| 2012/0250395 A1 | 10/2012 | Nodin | |
| 2012/0305879 A1 | 12/2012 | Lu et al. | |
| 2012/0314472 A1 | 12/2012 | Chung | |
| 2013/0001501 A1 | 1/2013 | Sills | |
| 2013/0264534 A1 | 10/2013 | Hwang et al. | |
| 2013/0313508 A1 | 11/2013 | Kawasaki | |
| 2013/0334593 A1 | 12/2013 | Seol et al. | |
| 2014/0048860 A1 * | 2/2014 | Mikasa | H01L 27/108 257/296 |
| 2014/0063903 A1 | 3/2014 | Chang et al. | |
| 2014/0092669 A1 | 4/2014 | Chen et al. | |
| 2014/0098594 A1 | 4/2014 | Azuma et al. | |
| 2014/0112058 A1 | 4/2014 | Kellam et al. | |
| 2014/0231740 A1 | 8/2014 | Ohba | |
| 2014/0284544 A1 | 9/2014 | Miyagawa et al. | |
| 2014/0292365 A1 * | 10/2014 | Said | G01R 1/0416 324/756.05 |
| 2015/0070966 A1 * | 3/2015 | Bandyopadhyay | G11C 13/0069 365/148 |
| 2015/0074326 A1 | 3/2015 | Castro | |
| 2015/0076579 A1 | 3/2015 | Tsuji et al. | |
| 2015/0179662 A1 | 6/2015 | Makala et al. | |
| 2015/0179705 A1 | 6/2015 | Wouters et al. | |
| 2015/0187792 A1 | 7/2015 | Shingu et al. | |
| 2015/0294716 A1 | 10/2015 | Tortorelli et al. | |
| 2016/0012886 A1 | 1/2016 | Nazarian et al. | |
| 2016/0104715 A1 | 4/2016 | Pachamuthu et al. | |
| 2016/0111639 A1 | 4/2016 | Wells et al. | |
| 2016/0141337 A1 | 5/2016 | Shimabukuro et al. | |
| 2016/0190208 A1 | 6/2016 | Nazarian et al. | |
| 2016/0204117 A1 | 7/2016 | Liu et al. | |
| 2016/0211386 A1 * | 7/2016 | Tomai | H01L 29/47 |
| 2016/0268341 A1 | 9/2016 | Nazarian | |
| 2017/0104031 A1 | 4/2017 | Clark et al. | |
| 2017/0169887 A1 | 6/2017 | Widjaja | |
| 2017/0352410 A1 | 12/2017 | Castro | |

FOREIGN PATENT DOCUMENTS

| | | |
|---|---|---|
| CN | 101501850 A | 8/2009 |
| CN | 102986048 A | 3/2013 |
| CN | 103682091 A | 3/2014 |

(56) References Cited

FOREIGN PATENT DOCUMENTS

| | | | |
|---|---|---|---|
| JP | 2000058681 A | 2/2000 |
| JP | 2001249324 A | 9/2001 |
| JP | 2008277543 A | 11/2008 |
| JP | 2009267185 A | 11/2009 |
| JP | 2010009669 A | 1/2010 |
| JP | 2010087007 A | 4/2010 |
| JP | 2010519762 A | 6/2010 |
| JP | 2010186872 A | 8/2010 |
| JP | 201123645 A | 2/2011 |
| JP | 2011129639 A | 6/2011 |
| JP | 2014036034 A | 2/2014 |
| TW | 201214673 A | 4/2012 |
| WO | 2011005266 A1 | 1/2011 |
| WO | 2013052321 A2 | 4/2013 |

OTHER PUBLICATIONS

Taiwanese Office Action dated Aug. 11, 2016 for Taiwanese Application No. 104121989, 10 pages (including translation).
Office Action dated Jul. 14, 2016 for U.S. Appl. No. 14/793,392, 28 pages.
Office Action dated Jul. 13, 2016 for U.S. Appl. No. 14/755,998, 22 pages.
Office Action dated May 31, 2016 for U.S. Appl. No. 14/678,112, 14 pages.
Notice of Allowance dated Oct. 20, 2016 for U.S. Appl. No. 15/066,504, 28 pages.
Japanese Office Action dated Aug. 2, 2016 for Japanese Application No. 2015-102280, 13 pages (including translation).
Taiwanese Office Action dated Aug. 19, 2016 for Taiwanese Application No. 104107381, 7 pages (including translation).
Japanese Office Action dated Aug. 9, 2016 for Japanese Application No. 2015-137033, 6 pages (including translation).
Office Action dated Mar. 17, 2015 for U.S. Appl. No. 14/573,770, 19 pages.
Wouters, "Scaling challenges for 2-terminal select devices," ITRS ERD Selector Workshop, Apr. 2012, 41 pages, IMEC, Noorderwijk, NL.
Office Action dated May 27, 2015 for U.S. Appl. No. 14/588,185, 23 pages.
International Search Report and Written Opinion for PCT Application No. PCT/US2015/17370 dated Jul. 13, 2015, 17 pages.
Office Action dated Oct. 3, 2013 for U.S. Appl. No. 13/921,157, 10 pages.
International Search Report and Written Opinion for PCT Application No. PCT/US2012/040232 dated Feb. 26, 2013, 9 pages.
Office Action dated May 7, 2013 for U.S. Appl. No. 13/585,759, 12 pages.
Office Action dated May 23, 2013 for U.S. Appl. No. 13/592,224, 9 pages.
Notice of Allowance dated Sep. 19, 2013 for U.S. Appl. No. 13/585,759, 9 pages.
Office Action dated Dec. 6, 2013 for U.S. Appl. No. 13/960,735, 10 pages.
International Search Report and Written Opinion for PCT Application No. PCT/US2013/054976 dated Dec. 16, 2013, 9 pages.
Notice of Allowance dated Jul. 22, 2015 for U.S. Appl. No. 14/612,025, 11 pages.
Chinese Office Action (with English translation) dated Nov. 23, 2015 for Chinese Patent Application No. 201280027066.9, 12 pages.
Office Action dated Aug. 3, 2015 for U.S. Appl. No. 14/717,185, 26 Pages.
Ex Parte Quayle Office Action dated Aug. 18, 2016 for U.S. Appl. No. 14/795,105, 13 Pages.
Chinese Office Action dated Dec. 27, 2016 for Chinese Patent Application No. 201510105630.X, 16 pages (including English translation).
Taiwanese Office Action dated Oct. 19, 2016 for Taiwanese Application No. 104122122, 7 pages (including translation).
Office Action dated Dec. 22, 2016 for U.S. Appl. No. 14/641,466, 45 pages.
Office Action dated Dec. 29, 2016 for U.S. Appl. No. 15/195,417, 38 pages.
Chinese Office Action dated Apr. 5, 2017 for Chinese Patent Application No. 201510260810.5, 16 pages (including English translation).
Korean Office Action dated Feb. 27, 2017 for Korean Application No. 10-2015-0096673, 7 pages (including English translation).
Korean Office Action dated Mar. 6, 2017 for Korean Application No. 10-2015-0097600, 5 pages (including English translation).
Office Action dated Apr. 8, 2016 for U.S. Appl. No. 14/573,770, 8 pages.
Office Action dated Jun. 19, 2012 for U.S. Appl. No. 13/149,757, 11 pages.
Office Action dated Dec. 6, 2013 for U.S. Appl. No. 13/960,735, 19 pages.
Office Action dated Oct. 30, 2017 for U.S. Appl. No. 15/495,574, 48 pages.
Notice of Allowance dated Jul. 31, 2017 for U.S. Appl. No. 15/195,458, 58 pages.
Office Action dated Aug. 29, 2017 for U.S. Appl. No. 15/256,007, 59 pages.
Office Action dated Oct. 6, 2017 for U.S. Appl. No. 15/469,179, 29 pages.
Search Report dated Dec. 27, 2016 for Chinese Patent Application No. 201510105630.X, 1 page.
Korean Office Action dated Oct. 30, 2017 for Korean Application No. 10-2015-0096673, 7 pages (including English translation).
European Office Action and Search Report dated Oct. 18, 2017 for European Application No. 15762196.2, 7 pages.
Chinese Office Action dated Dec. 11, 2017 for Chinese Patent Application No. 201510260810.5, 6 pages (including English translation).
Office Action dated Jan. 11, 2018 for U.S. Appl. No. 14/793,392, 53 pages.
Office Action dated Jan. 26, 2017 for U.S. Appl. No. 14/793,392, 39 pages.
Communication pursuant to Rules 70(2) and 70a(2) EPC dated Nov. 7, 2017 issued in European Application No. 15762196.2, 1 page.
Final Office Action dated May 25, 2018 for U.S. Appl. No. 15/256,007.
Notice of Allowance dated May 16, 2018 for U.S. Appl. No. 15/469,179, 37 pages.
Notice of Allowance dated Jul. 2, 2018 for U.S. Appl. No. 15/797,447, 38 pages.
Search Report dated Jul. 8, 2016 for Japanese Application No. JP2015-137033, 16 pages.

\* cited by examiner

RECESSED HIGH VOLTAGE METAL OXIDE SEMICONDUCTOR TRANSISTOR FOR RRAM CELL

TECHNICAL FIELD

The subject disclosure relates generally to resistive memory, and as one illustrative example, a recessed high voltage metal oxide semiconductor transistor for a two-terminal memory cell.

BACKGROUND

The inventors of the present disclosure have proposed models of two-terminal memory devices that they expect to operate as viable alternatives to various memory cell technologies, such as metal-oxide semiconductor (MOS) type memory cells employed for electronic storage of digital information. Models of memory cells using two-terminal memory such as resistive-switching memory devices among others, are believed by the inventors to provide some potential advantages over purely non-volatile FLASH MOS type transistors, including smaller die size, higher memory density, faster switching (e.g., from a relatively conductive state to a relatively non-conductive state, or vice versa), good data reliability, low manufacturing cost, and other advantages, for example.

One memory model proposed by the assignee of the present disclosure is resistive switching memory. The inventors believe resistive switching memory can hold substantial advantages over competing technologies in the semiconductor electronics industry, including, e.g., high density non-volatile storage. A resistive switching device, according to some models proposed by the inventors, has an insulator layer that is provided between a pair of electrodes and exhibits electrical pulse induced hysteretic resistance switching effects. The inventor has suggested that a filament(s) can be formed between the electrodes by a diffusion and/or drift of ions caused by a suitable external stimulus applied to the electrodes, which results in a measurable change in the resistance of the structure. Moreover, this change in resistance can remain after removal of the external stimulus, giving the device a non-volatile characteristic in a programmed state. The inventors are currently involved in research and development to explore additional characteristics and advantages of two-terminal memory in general.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Various embodiments disclosed herein provide a method for fabricating a metal oxide semiconductor (MOS) transistor for a two-terminal memory device. The method can comprise forming a gate recess into a surface of a semiconductor substrate. The method can also comprise depositing an electrically insulating dielectric layer at least over a recess surface of the semiconductor substrate exposed by the gate recess. The method can also comprise forming a recess gate over and at least in part within the gate recess, extending below the top surface of the semiconductor substrate. The method can further comprise forming a source and a drain in the semiconductor substrate on opposing sides of the recessed gate and the method can additionally comprise forming the two-terminal memory device over the semiconductor substrate and in electrical series with the source or the drain.

In another embodiment, a recessed MOS transistor device can comprise a semiconductor substrate a gate formed at least in part into a recess in a surface of the semiconductor substrate and having a feature size in a direction parallel to the surface of the semiconductor substrate that is less than about 100 nm. The recessed MOS transistor device can also comprise a dielectric material between the gate and the semiconductor substrate. The recessed MOS transistor device can further comprise a source region on a first side of the gate and a drain region on an opposing side of the gate, wherein at least one of the source region and drain region are connected to a resistive switching device, the recessed MOS transistor device and the resistive switching device form a 1T-1R memory device and an activation voltage between the source and the drain is greater than three volts.

In yet another embodiment, a memory cell can comprise a resistive switching device and a MOS transistor device serially connected to the resistive switching device. The MOS transistor device can further comprise a semiconductor substrate and a gate formed into a recess in the semiconductor substrate. The MOS transistor device can further comprise a dielectric material between the gate and the semiconductor substrate. The MOS transistor device can additionally comprise a source region and a drain region on either side of the gate, wherein at least one of the source region and drain region are connected to the resistive switching device and a minimum feature size of the gate projected onto a top surface of the semiconductor substrate is no greater than about 100 nm.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
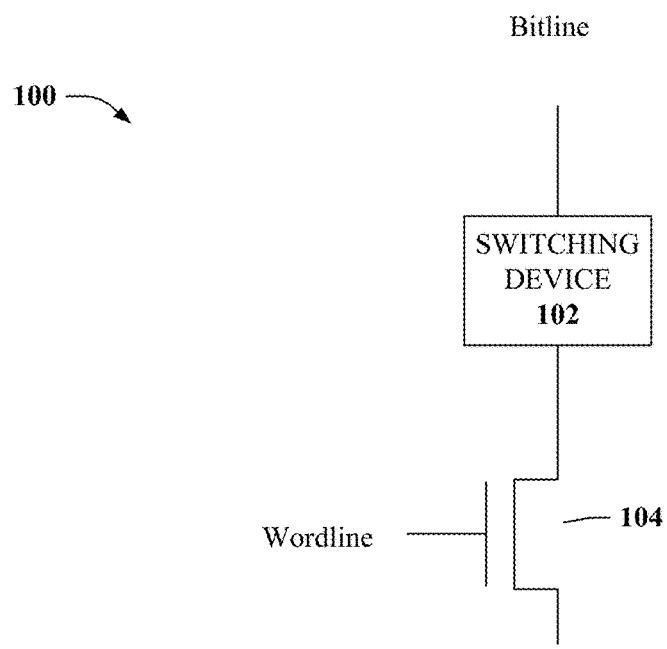
FIG. 1 illustrates a schematic diagram of an example two-terminal memory cell in accordance with various aspects described herein.

This disclosure relates to a recessed high voltage metal oxide semiconductor (MOS) transistor for use in one or more two-terminal memory cells. The two-terminal memory cell(s) can also include a resistive switching device connected to the recessed MOS transistor. A recessed MOS transistor provides for an increased channel length (e.g., conductive path between source and drain) relative to the transistor size (e.g., projected feature size, projected surface area, etc.) in comparison to a traditional MOS transistor. This allows for a MOS transistor having decreased surface area while maintaining comparable electrical parameters (threshold voltage, channel length, and leakage) as a 0.35 um gate MOS transistor, for example. Such a MOS transistor can scale much more effectively with smaller two-terminal memory cells, without sacrificing target electrical parameters. The recessed MOS transistor can be made as either a NMOS or PMOS device using n-type or p-type materials respectively, where the channel, or inversion layer, is formed by electrons (NMOS) or holes (PMOS) within a transistor well (e.g., p-well, n-well) between the source and drain.

In various embodiments, a disclosed two-terminal switching device can be a filamentary-based device. One example of a filamentary-based device can comprise: a conductive layer, e.g., metal (e.g. metal, metal nitride, alloy, Ti, TaN, etc.), doped p-type (or n-type) silicon (Si) bearing layer (e.g., p-type or n-type polysilicon, p-type or n-type polycrystalline SiGe, etc.); a resistive switching layer (RSL); and an active metal layer capable of being ionized (e.g. metal, metal alloy, Al, Ag, etc.). Under suitable conditions, the active metal layer can provide filament forming ions to the RSL. In such embodiments, a conductive filament (e.g., neutral metal particles formed from the ions from the active metal layer) can facilitate electrical conductivity through at least a subset of the RSL, and a resistance of the filament-based device can be determined by a tunneling resistance between the filament and the conductive layer, or by an inherent resistivity of a conductive short through the RSL (e.g., formed by the neutral metal particles from the active metal layer within the RSL). According to further embodiments, the conductive layer can additionally comprise a metal capable of being ionized. In such embodiments, the conductive layer can also provide filament forming ions to the RSL in response to a second suitable condition(s). For instance, in response to a signal of a first polarity having a suitable magnitude, a filament can be formed at least in part of the active metal layer ions from the active metal layer toward the conductive layer, and in response to a second signal of a second polarity having a second suitable magnitude, a second filament can be formed at least in part of the metal ions from the conductive layer toward the active metal layer.

In various embodiments of a memory cell of the present disclosure, a p-type or n-type Si bearing layer can include a p-type or n-type polysilicon, p-type or n-type polycrystalline SiGe, or the like. A RSL (which can also be referred to in the art as a resistive switching media (RSM)) can comprise, e.g., an undoped amorphous Si layer, a semiconductor layer having intrinsic characteristics, a Si sub-oxide/nitride/oxynitride (e.g., SiOx, SiOxNy, SiNx), an insulating layer with a non-stoichiometric composition, and so forth. Other examples of materials suitable for the RSL could include $Si_XGe_YO_Z$ (where X, Y and Z are respective suitable positive numbers), a silicon oxide (e.g., $SiO_N$, where N is a suitable positive number), amorphous Si (a-Si), amorphous SiGe (a-SiGe), $TaO_B$ (where B is a suitable positive number), $HfO_C$ (where C is a suitable positive number), $TiO_D$ (where D is a suitable number), $Al_2O_E$ (where E is a suitable positive number) and so forth, or a suitable combination thereof. In various embodiments, the RSL includes a number of material voids or defects (e.g., for non-volatile characteristics) or can include relatively few material voids or defects (e.g., for volatile characteristics).

An active metal layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), hafnium (Hf), and palladium (Pd). Other suitable conductive materials, as well as as non-stoichiometric metallic compounds, alloys, nitrides, or combinations of the foregoing or similar materials can be employed for the active metal layer in some aspects of the subject disclosure. Some details pertaining to embodiments of the subject disclosure similar to the foregoing example(s) can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

In various disclosed embodiments, filamentary-based switching devices are disclosed and their operation is described. In some embodiments, a filamentary-based switching device can be a volatile switching device, which exhibits a first measurably distinct state in the absence of a suitable external stimulus (or stimuli), and exhibits a second measurably distinct state in response to the suitable external stimulus (or stimuli). The volatile filamentary-based switching device is often referred to herein as a selector device, or selection device, filamentary selector device, filamentary-based selector device, and so on; though such devices, their composition or application should not be limited by this terminology. In various embodiments, a filamentary selector device can be included within a disclosed circuit to facilitate formation of a non-volatile memory cell, having very fast performance and low leakage current.

In other embodiments, a filamentary-based switching device can be a non-volatile device. For the non-volatile switching device, a conductive filament can form in response to a first stimulus (e.g., a program signal), and remain until application of a suitable second stimulus (e.g., an erase signal). Further, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

Resistive random access memory is one example of a two-terminal switching device, though the inventors are familiar with other examples. Ferroelectric random access memory (RAM) is one such example. Others include magneto-resistive RAM, organic RAM, phase change RAM and conductive bridging RAM, and so on. Two-terminal memory technologies have differing advantages and disadvantages, and trade-offs between advantages and disadvantages are common. For instance, various subsets of these devices can have relatively fast switching times, good durability, high memory density, low cost fabrication, long life, or the like, or combinations thereof. Meanwhile, the various subsets can also be difficult to fabricate, have compatibility problems with many common CMOS fabrication processes, poor read performance, small on/off resistance ratios, small on/off resistance ratios (e.g., leading to small sensing margin) or poor thermal stability, as well as other problems. Though resistive-switching memory technology is considered by the inventors to be one of the best technologies having the most benefits and least detriments, other two-terminal memory technologies capable of being operated with volatile characteristics in response to an external stimulus, can be utilized for some of the disclosed embodiments, where suitable to one of ordinary skill in the art.

Overview

A recessed MOS transistor can increase the channel length of the MOS transistor relative to the size (e.g., projected feature size, projected surface area, etc.) of the transistor. In traditional MOS transistors, as the technology feature size shrunk in each iteration (130 nm->90 m->55 nm etc), in order to maintain electrical parameters, the length of the conductive path between source and drain would remain roughly the same to maintain target electrical parameters. This limits effective scaling of the device, however, as below-substrate feature size (e.g., channel width, etc.) or above-substrate feature size (e.g., of back-end-of-line devices) can at least in part be controlled by a transistor's gate size. A conventional gate, positioned on an oxide layer above the substrate surface, in part controls the channel length of a conventional conductive path between source and drain.

A recessed MOS transistor, which extends the channel in a direction non-parallel with gate area, can allow for smaller transistor sizes while maintaining the same electrical parameters. A non-conductive dielectric layer can be placed over the recess to form the channel path around the recess, so that the channel is not formed on a straight line between the source and drain of the transistor. A gate is formed in the recess, and the recessed MOS transistor can operate between 2.5 V and 6V depending on the depth of the recessed gate and the gate thickness without having to increase the area of silicon that the transistor is formed on.

In an embodiment, the gate recess is roughly twice as deep as it is wide, with a width ranging between 15 nm to 130 nm (or approximations thereof), and a depth between 0.05 μm and 0.2 μm (or approximations thereof). The recess gate thickness can also be between about 0.05 μm and about 0.2 μm. The gate material can comprise at least one of polysilicon, metal gate (TaN or TiN) or silicide. A dielectric can be formed between the gate and the semiconductor substrate and can be formed from at least one of $SiO_2$ or $HfO_2$ with a thickness of between about 3 nm and about 7 nm.

The transistor can be either an NMOS type transistor or a PMOS type transistor using n-type or p-type materials respectively, where the channel, or inversion layer, is formed by electrons (NMOS) or holes (PMOS) between the source and drain in the transistor. In the NMOS transistor type, an N+ source and drain can be formed by implanting arsenic or phosphorus ions into the semiconductor substrate at up to 0.2 μm. In the PMOS transistor type, a P+ source and drain can be formed by implanting boron ions into the semiconductor substrate at up to (or about) 0.2 μm. N− and P− can be formed around the source and drain in each of the NMOS and PMOS type transistors respectively. A self aligned silicide with either Nickel, Cobalt, or Titanium can be formed above the source and drain regions.

Non-Limiting Examples of a Two-Terminal Memory Cell Utilizing Volatile Switching Two Terminal Device and a Recessed MOS Transistor Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing the subject disclosure.

Referring now to the drawings, in FIG. 1 illustrated is a schematic diagram of an example resistive switching memory cell 100 in accordance with various aspects described herein. Resistive switching memory cell 100 can include a resistive two-terminal selector device 102 that can be in a low resistive state or a high resistive state depending on the voltage being applied. The resistive switching memory cell can also include a recessed high voltage metal oxide semiconductor transistor 104. One of the terminals of the switching device 102 can be connected to a bitline in a memory cell array, and a gate of the recessed MOS transistor 104 can be connected to a wordline of the memory cell array. The gate of the recessed MOS transistor 104 can be recessed into a semiconductor substrate between the source and drain of the transistor, forcing the inversion layer to wrap around the bottom of the recess.

In an embodiment, the recessed MOS transistor 104 can have a channel length of about 0.35 μm. The transistor can also operate as a high voltage device; for instance, the transistor can activate/deactivate at magnitudes up to 4V in some embodiments. In other embodiments, recessed MOS transistor 104 can have an activation voltage in a range of about 2.5V to about 6V. Together with the resistive switching device 102, the recessed MOS transistor 104 forms a 1-transistor-1-resistive switching device (1T1R) device. In some embodiments, for instance where resistive switching device 102 is a non-volatile single level cell, the 1T1R device can store 1 bit. In other embodiments, for instance where resistive switching device 102 is a non-volatile multi-level cell (MLC), the 1T1R device can store 2 or more bits.

In some embodiments, switching device 102 can be a volatile resistive-switching selector device, termed a "selector device". The selector device can be a two-terminal device configured to be operable in response to a suitable electric signal applied at one or more of two terminals of selector device 102. In various disclosed embodiments, the selector device (102) can have a non-linear I-V response, in which selector device (102) exhibits current within a first range in response to a first range of voltage magnitudes, and current within a second range (e.g., much higher in magnitude than the first range) in response to a second range of voltage magnitudes (e.g., see FIG. 3, infra). The first range of voltage magnitudes and second range of voltage magnitudes can be distinguished, as one example, by a threshold voltage, or a threshold range of voltages (e.g., having magnitude(s) between the first range of voltage magnitudes and the second range of voltage magnitudes). In various embodiments, selector device (102) may be embodied as a FAST™ selector device, currently under development by the current assignee of the present patent application. Further details regarding the FAST™ selector device are detailed in co-pending U.S. application Ser. No. 14/588,185 filed Dec. 31, 2014.

Figure 2:
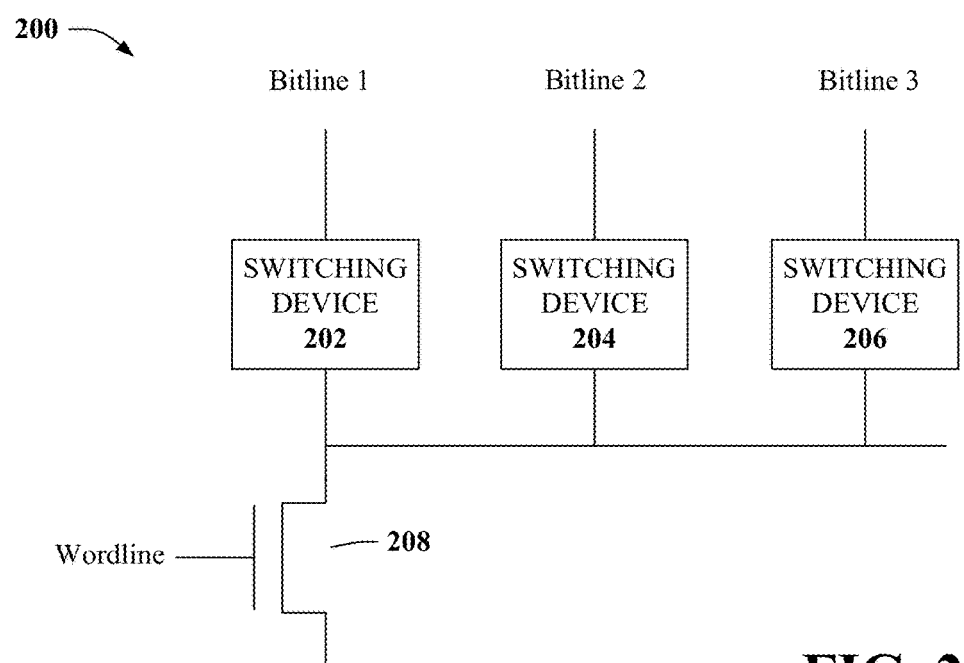
FIG. 2 illustrates a schematic diagram of an example of an array of switching devices in a two-terminal memory cell in accordance with various aspects described herein.

Turning now to FIG. 2, illustrated is a schematic diagram of an example of an array of switching devices in a resistive switching memory cell 200 in accordance with various aspects described herein. In memory cell array 200, a single recessed MOS transistor 208 can be connected to several switching devices (e.g., 202, 204, and 206), providing a 1TnR circuit where n is a number of the switching devices connected to recessed MOS transistor 208. Each of the switching devices 202, 204, and 206 can have a terminal connected to a bitline (e.g., bitline 1, bitline 2, and bitline 3) while the gate of the recessed MOS transistor 208 is coupled to a wordline. In other embodiments, depending on the configuration of the memory cell array 200, recessed MOS transistor 208 can be connected to fewer than three, or more than three switching devices.

Figure 3:
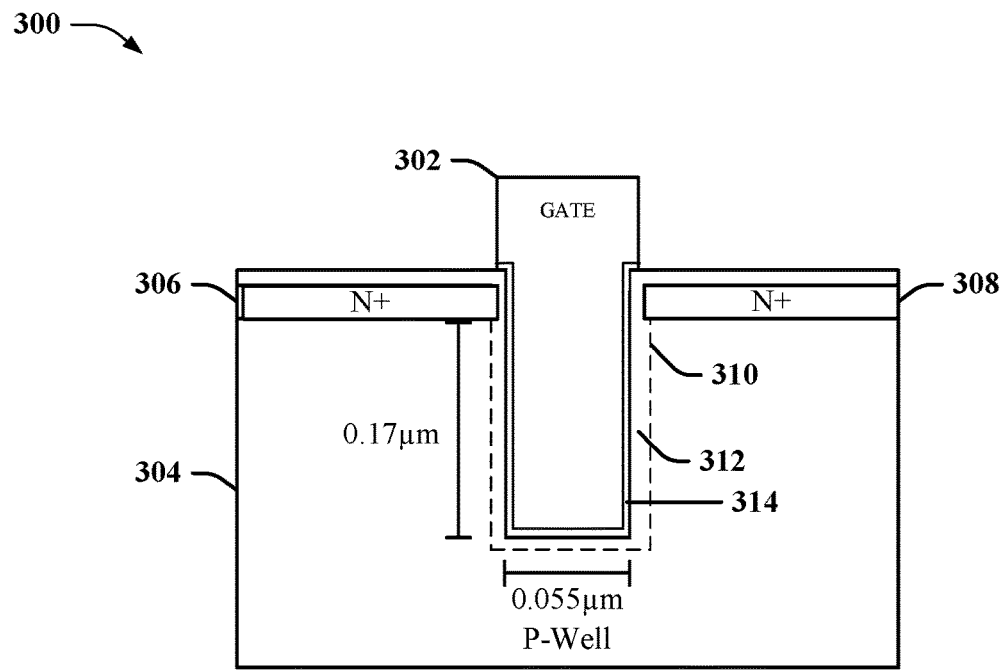
FIG. 3 illustrates a schematic diagram of an example of a recessed high voltage metal oxide semiconductor transistor in accordance with various aspects described herein.

FIG. 3 illustrates a schematic diagram of an example of a recessed high voltage metal oxide semiconductor transistor 300 in accordance with various aspects described herein. The example shown in FIG. 3 is a simplified version of a recessed MOS transistor shown for explanatory purposes. It is also to be appreciated that while the example shown is a NMOS type transistor, in other embodiments, PMOS type transistors are possible.

In the embodiment shown in FIG. 3, recessed MOS transistor can include a semiconductor substrate 304 that is a P-well for the NMOS transistor, and can have a recess 312 with a gate 302 extending at least in part into the recess. The gate can be formed between N+ regions, source 306 and a drain 308, that are formed by ion implantation using arsenic or phosphorous ions. The gate can be selected from polysilicon, TaN, TiN, or silicide materials or a suitable combination thereof. A dielectric layer 314 can be formed between the gate and the semiconductor substrate and can be formed from either $SiO_2$ or $HfO_2$ or the like, or suitable combination thereof. The thickness of the dielectric layer can be between about 3 nm and about 7 nm, in some embodiments.

In an embodiment, the depth of the recess 312 can be (about) 0.17 μm, while the diameter of the recess can be (about) 0.055 μm. This can allow the channel length of the inversion layer 310 to be roughly 0.35 μm (e.g., 0.17

μm*2+0.055 μm, or 0.395 μm). It is to be appreciated that the drawing in FIG. 3 is not to scale; while the width and depth of the recess 312 are about the same size in the image, in actuality, the depth can be much larger than the width, which allows for surface area of gate 302 (e.g., as projected onto a top surface of semiconductor substrate 304) to decrease in size, while maintaining the channel length of the inversion layer 310, and associated electrical characteristics of recessed MOS transistor 300. In the embodiment shown in FIG. 3, the width of the recessed MOS transistor is roughly 55 nm plus the width of the source and drain regions, whereas for a traditional MOS transistor with a channel length of 0.35 μm, the width is 350 nm plus the source and drain—nearly 7 times larger. Thus the recessed MOS transistor allows for much smaller sizes (e.g., projected surface area) of the two-terminal memory cell.

It is also to be appreciated that in the case where the recessed MOS transistor 300 is a PMOS transistor, the source and drain regions 306 and 308 can be a P+ region formed by implantation of boron ions, and the semiconductor substrate 304 can form an N-well. The depth of the N+ regions (or P+) regions 306 and 308 can be up to 0.2 μm deep into the semiconductor substrate.

Figure 4:
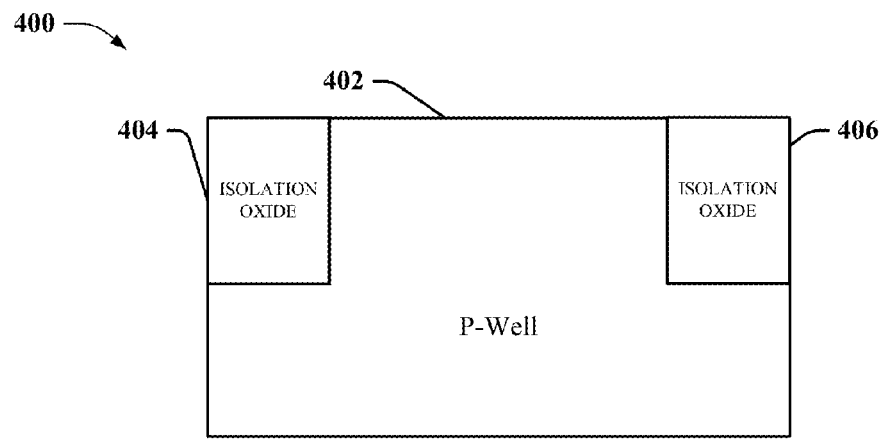
FIG. 4 illustrates a schematic diagram of a step in the fabrication process of a recessed high voltage metal oxide semiconductor transistor in accordance with various aspects described herein.

Turning now to FIG. 4, illustrated is a schematic diagram of a step in fabricating a recessed high voltage metal oxide semiconductor transistor 400 in accordance with various aspects described herein. The process starts with piece of semiconductor substrate 402 and a P-Well (for a NMOS type transistor) is formed in the semiconductor substrate 402. Two sets of isolation oxides 404 and 406 can be formed on either side of the P-well/semiconductor substrate 402.

Figure 5:
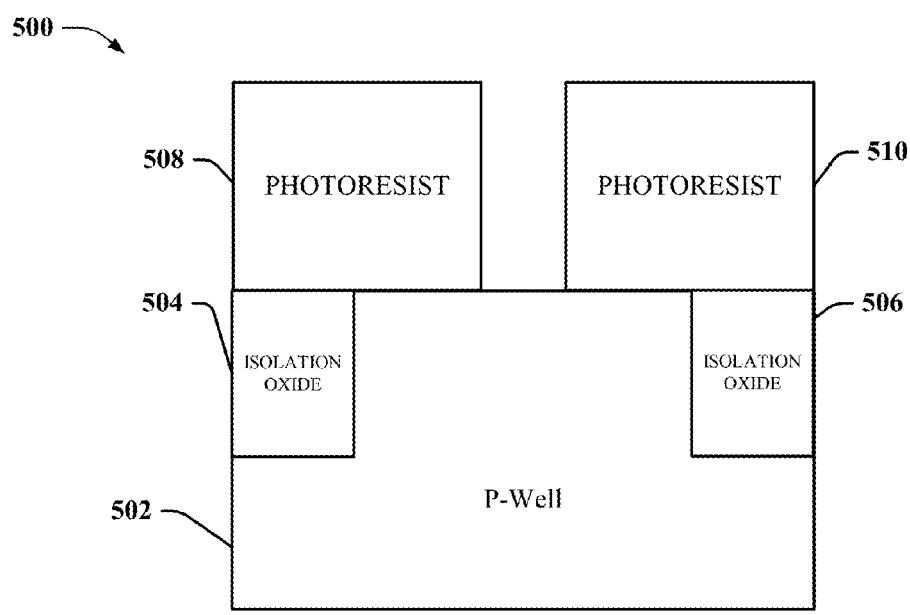
FIG. 5 illustrates a schematic diagram of a step in the fabrication process of a recessed high voltage metal oxide semiconductor transistor in accordance with various aspects described herein.
Figure 6:
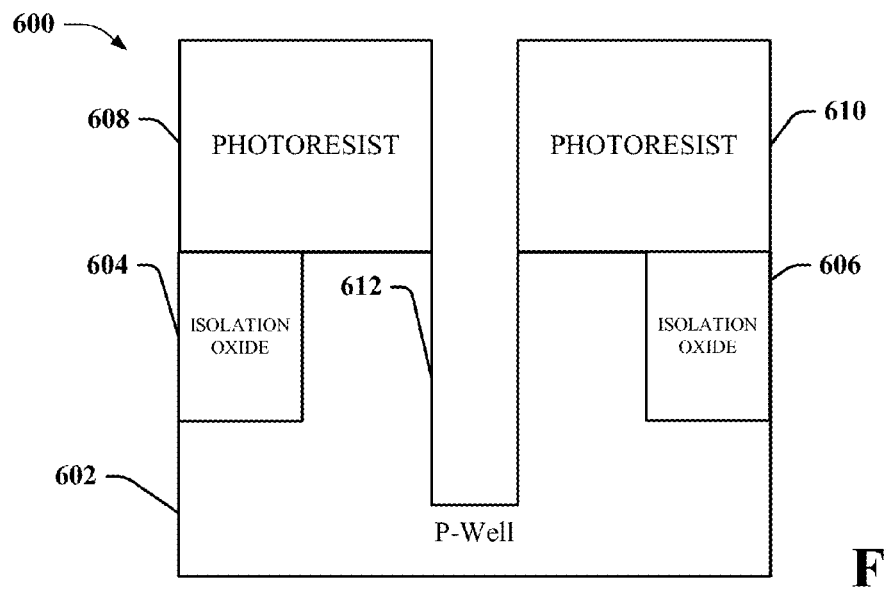
FIG. 6 illustrates a schematic diagram of a step in the fabrication process of a recessed high voltage metal oxide semiconductor transistor in accordance with various aspects described herein.

FIG. 5 illustrates a schematic diagram of a step in the fabrication process of a recessed high voltage metal oxide semiconductor transistor 500 in accordance with various aspects described herein. At the step in the fabrication process shown in FIG. 5, photoresist layers 508 and 510 are formed over the isolation oxides 504 and 506 and the semiconductor substrate 502. The gap between the photoresist layers 508 and 510 can be less than 100 nanometers (nm) in some embodiments. In at least one embodiment, the gap can be (about) 0.055 μm, which will be the width of the recess formed after the etching is performed in FIG. 6. During etching in FIG. 6, the photoresist layers 608 and 610 protect the surface of the semiconductor substrate 602 and isolation oxides 604 and 606, but a recess 612 is etched into the semiconductor substrate 602 where there was a gap between the photoresist layers 608 and 610. The recess 612 can be roughly (about) 0.17 μm deep, while the width can be around 0.055 μm. It is to be appreciated that while FIG. 6 (and other FIGs.) are shown from a side perspective, if shown from a top down perspective, the recess 612 would form, or resemble a trench from one end of the semiconductor substrate to the other. Similarly, the isolation oxide can be formed, e.g., as a ring around the semiconductor substrate with the recess 612 abutting or cutting through the isolation oxide at each end.

Figure 7:
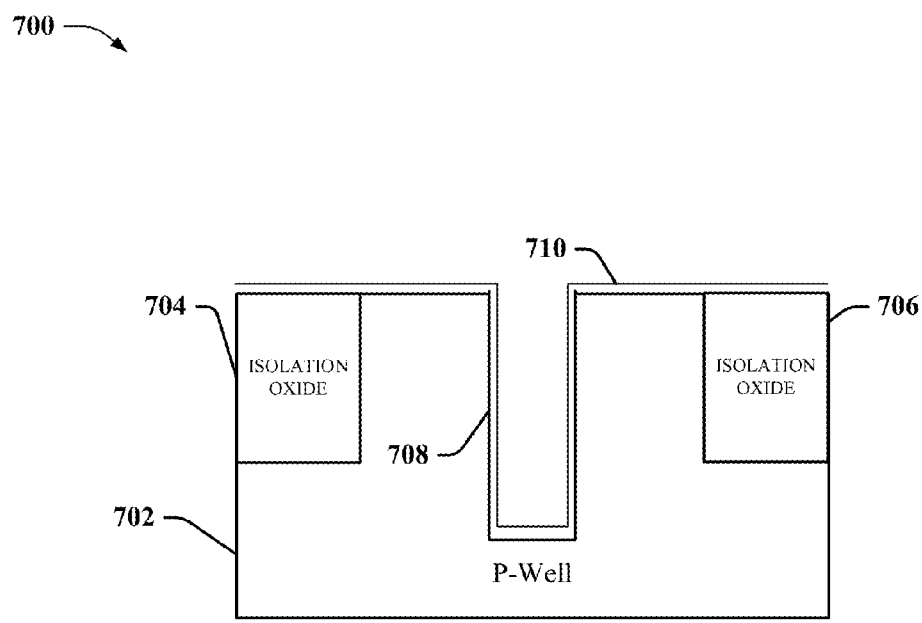
FIG. 7 illustrates a schematic diagram of a step in the fabrication process of a recessed high voltage metal oxide semiconductor transistor in accordance with various aspects described herein.

Turning now to FIG. 7, illustrated is a schematic diagram of another step in the fabrication process of a recessed high voltage metal oxide semiconductor transistor 700 in accordance with various aspects described herein. In FIG. 7, a gate oxide layer 710 is formed over the semiconductor substrate 702, the isolation oxides 704 and 706 and in the recess 708 (e.g., over a surface of the semiconductor substrate formed by recess 708). This dielectric oxide layer 710 can comprise either $SiO_2$ or $HfO_2$ and can range in thickness between about 3 nm and about 7 nm. In one embodiment, the gate oxide layer 710 can be formed by oxidation, and in other embodiments, the gate oxide layer 710 can be deposited (at high temperatures).

Figure 8:
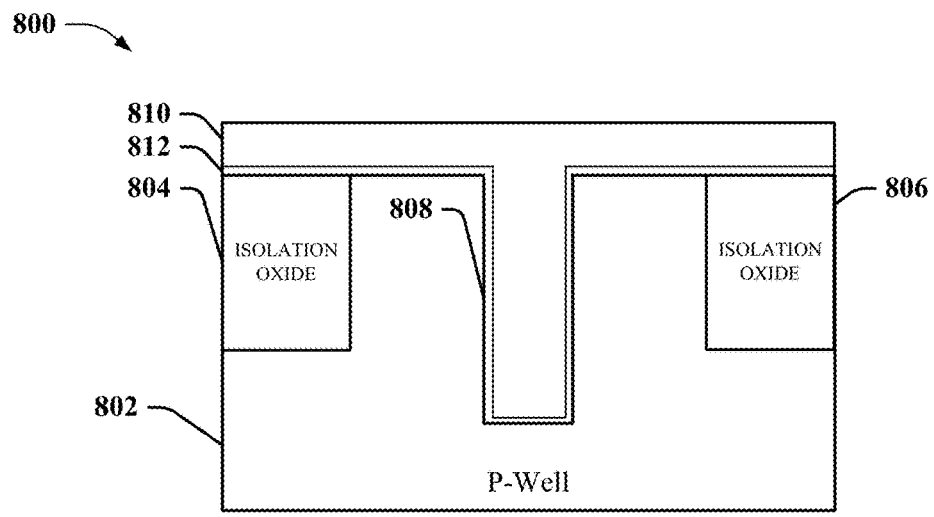
FIG. 8 illustrates a schematic diagram of a step in the fabrication process of a recessed high voltage metal oxide semiconductor transistor in accordance with various aspects described herein.

FIG. 8 depicts a schematic diagram of a step in the fabrication process of a recessed high voltage metal oxide semiconductor transistor 800 in accordance with various aspects described herein. In FIG. 8 the gate 810 is deposited onto the gate oxide 812 and semiconductor substrate 802. The gate 810 can cover the isolation oxides 804 and 806 and fill the recess 808. The gate can be formed from a conductive material such as polysilicon, metal (TaN, or TiN, silicide or salicide), and can have a width selected from between (about) 15 nm and (about) 130 nm and can also have a depth between (about) 0.05 μm and (about) 0.2 μm and a thickness between (about) 0.05 μm and (about) 0.2 μm.

Figure 9:
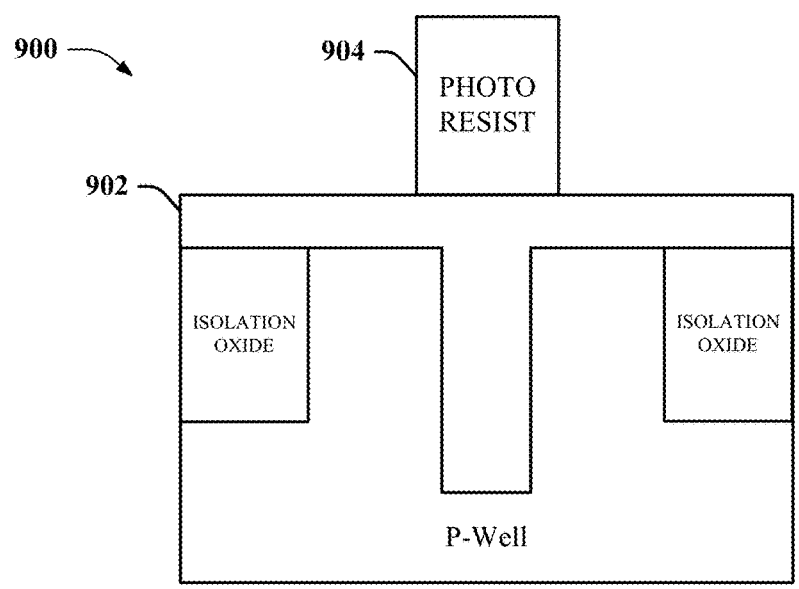
FIG. 9 illustrates a schematic diagram of a step in the fabrication process of a recessed high voltage metal oxide semiconductor transistor in accordance with various aspects described herein.
Figure 10:
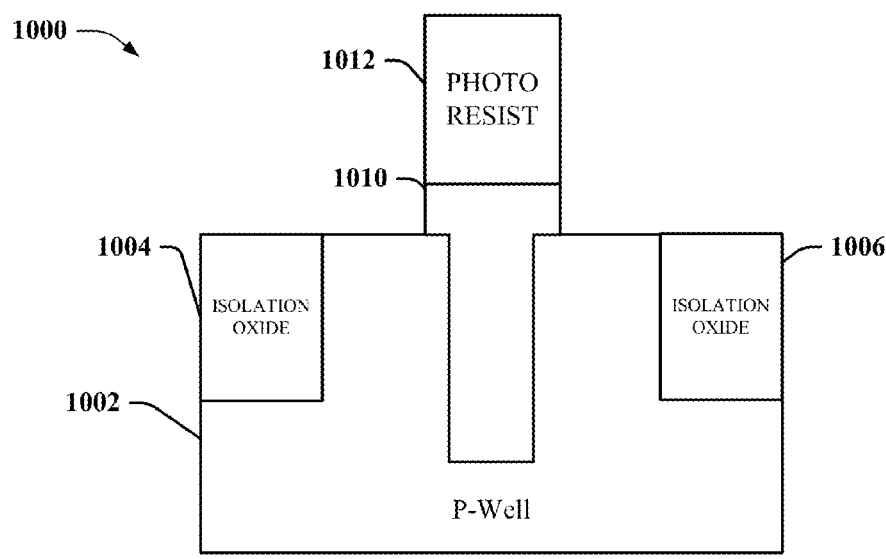
FIG. 10 illustrates a schematic diagram of a step in the fabrication process of a recessed high voltage metal oxide semiconductor transistor in accordance with various aspects described herein.

FIG. 9 illustrates a schematic diagram of a step in the fabrication process of a recessed high voltage metal oxide semiconductor transistor 900 in accordance with various aspects described herein. At the step in the fabrication process shown in FIG. 9, a photoresist layer 904 is formed over the gate 902 and in FIG. 10, during the etching process, the photoresist layer 1012 protects the gate 1010 over the recess but the unprotected portions of the gate deposited material over the isolation oxides 1004 and 1006 and the semiconductor substrate 1002 are etched away.

Figure 11:
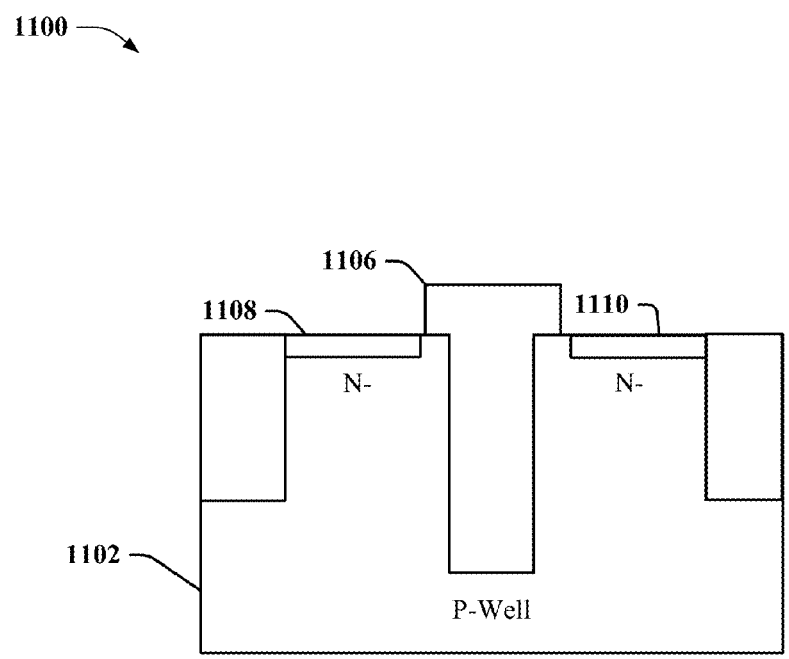
FIG. 11 illustrates a schematic diagram of a step in the fabrication process of a recessed high voltage metal oxide semiconductor transistor in accordance with various aspects described herein.

Turning now to FIG. 11, illustrated is a schematic diagram of a step in the fabrication process of a recessed high voltage metal oxide semiconductor transistor 1100 in accordance with various aspects described herein. In FIG. 11, the lightly doped drain and source regions 1110 and 1108 respectively are formed in the semiconductor substrate 1102. The lightly doped drain and source regions 1110 and 1108 are formed by ion implantation with arsenic or phosphorous (for NMOS type transistors) or boron (for PMOS type transistors), where the depth is up to (about) 0.2 μm. These lightly doped regions can be N− regions.

Figure 12:
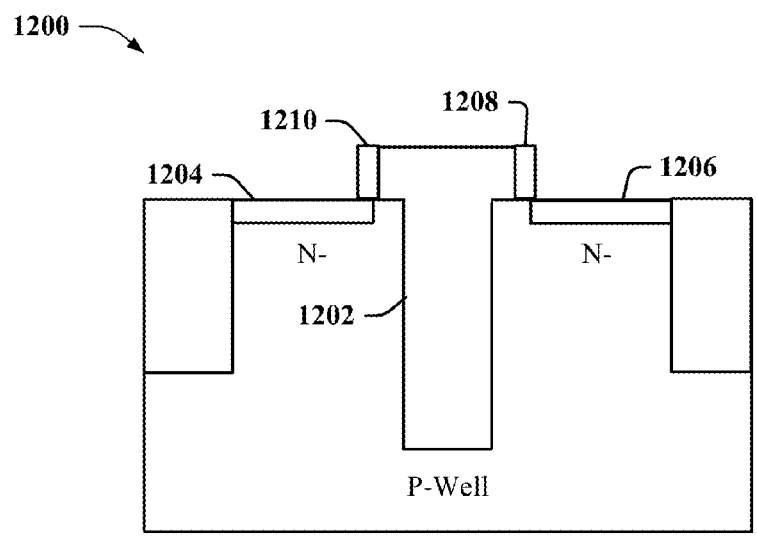
FIG. 12 illustrates a schematic diagram of a step in the fabrication process of a recessed high voltage metal oxide semiconductor transistor in accordance with various aspects described herein.

Turning now to FIG. 12, illustrated is a schematic diagram of a step in the fabrication process of a recessed high voltage metal oxide semiconductor transistor 1200 in accordance with various aspects described herein. In FIG. 12, dielectric spacers 1210 and 1208 are formed on either side of the gate, and next to the lightly doped drain and source regions 1206 and 1204. In an embodiment, the dielectric spacers 1210 and 1208 can be formed in an oxidation step.

Figure 13:
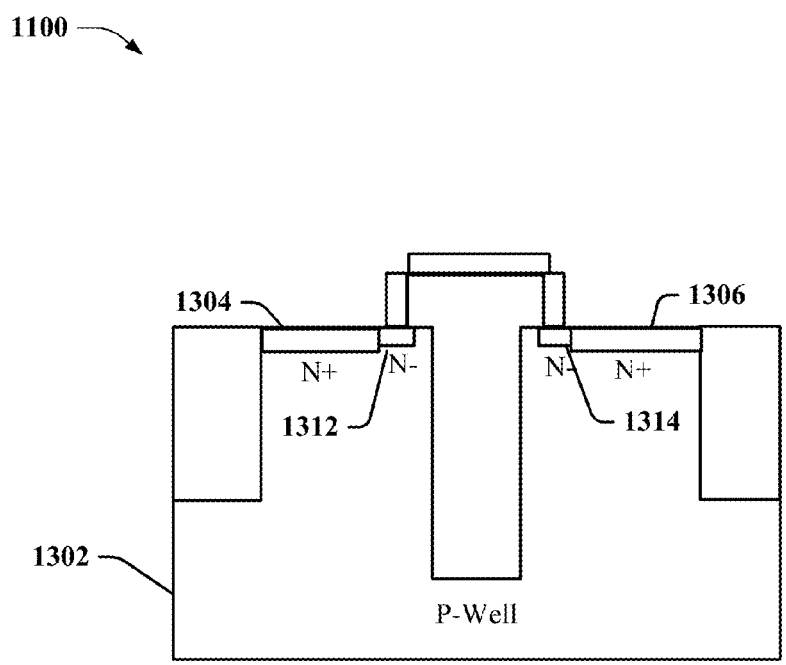
FIG. 13 illustrates a schematic diagram of a step in the fabrication process of a recessed high voltage metal oxide semiconductor transistor in accordance with various aspects described herein.

Turning now to FIG. 13, illustrated is a schematic diagram of a step in the fabrication process of a recessed high voltage metal oxide semiconductor transistor 1300 in accordance with various aspects described herein. In FIG. 11, the drain and source regions 1306 and 1304 respectively are formed in the semiconductor substrate 1302 next to the lightly doped drain and source regions 1314 and 1312 respectively. The drain and source regions 1306 and 1304 are formed by ion implantation with arsenic or phosphorous (for NMOS type transistors) or boron (for PMOS type transistors), where the depth is up to (about) 0.2 μm. These ion implanted regions can be N+ regions.

Figure 14:
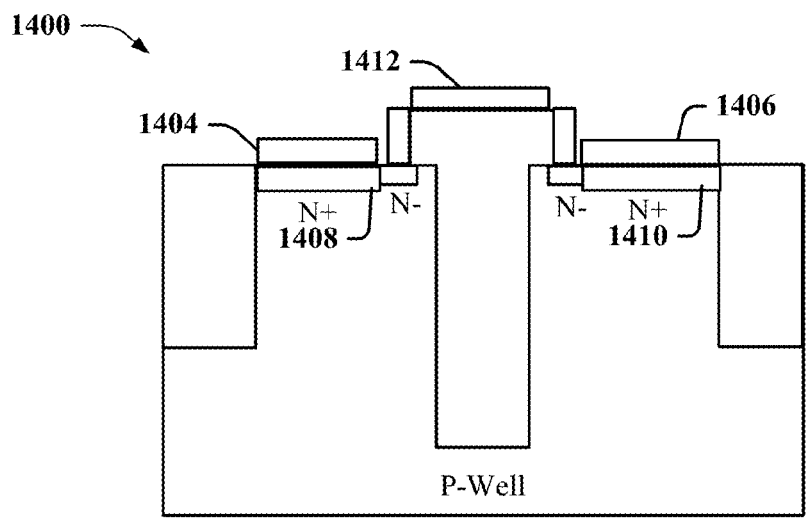
FIG. 14 illustrates a schematic diagram of a step in the fabrication process of a recessed high voltage metal oxide semiconductor transistor in accordance with various aspects described herein.

Turning now to FIG. 14, illustrated is a schematic diagram of a step in the fabrication process of a recessed high voltage metal oxide semiconductor transistor 1400 in accordance with various aspects described herein. In FIG. 14, salicide regions 1404 and 1406 are formed above the source and drain regions 1408 and 1410. The salicide can be formed from either Nickel, Cobalt, or Titanium, or a suitable combination thereof. These salicide regions form ohmic contacts to the resistive switching device and or the bitlines. The gate can have a salicide spacer 1412 that can cover the gate and also form an ohmic contact for the wordlines.

Figure 15:
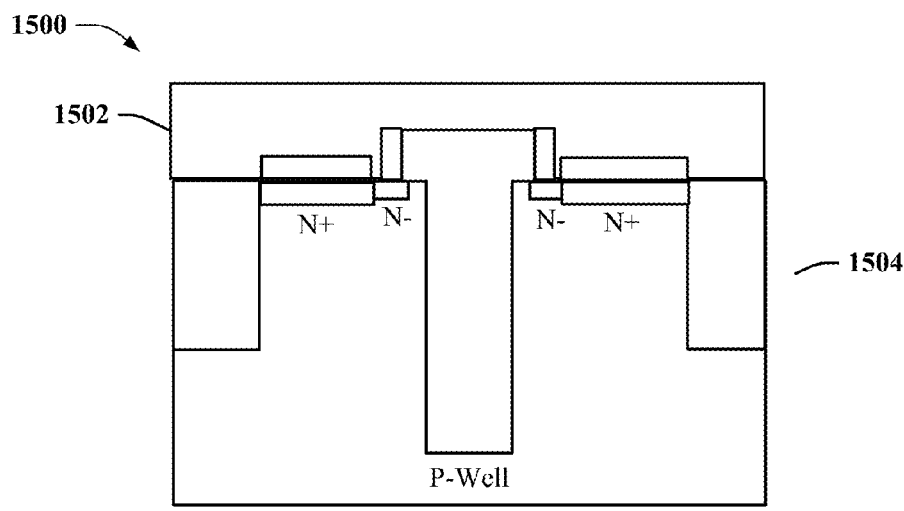
FIG. 15 illustrates a schematic diagram of a step in the fabrication process of a resistive random access memory cell connected to the recessed high voltage metal oxide semiconductor layer.
Figure 16:
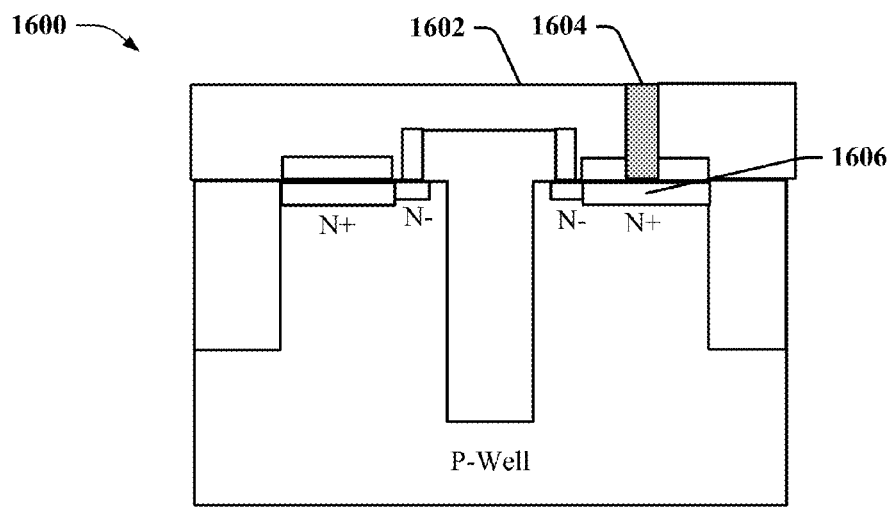
FIG. 16 illustrates a schematic diagram of a step in the fabrication process of a resistive random access memory cell connected to the recessed high voltage metal oxide semiconductor layer.

FIG. 15 illustrates a schematic diagram 1500 of a step in the fabrication process of a resistive random access memory cell connected to the recessed high voltage metal oxide semiconductor layer. A dielectric layer 1502 can be deposited overlying the recessed high voltage metal oxide semiconductor transistor 1504. The dielectric material 1502 can be silicon oxide, silicon nitride, a dielectric stack of alternating layers of silicon oxide and silicon nitride (for example, an ONO stack), a low K dielectric, a high K dielectric, or a combination, and others, depending on the application. First dielectric material 1502 can be deposited using techniques such as chemical vapor deposition, including low pressure chemical vapor deposition, plasma enhanced chemical vapor deposition, atomic layer deposition (ALD), physical vapor deposition, including any combination of these, and others FIG. 16 illustrates a schematic diagram 1600 of a step in the fabrication process of a resistive random access memory cell connected to the recessed high voltage metal oxide semiconductor layer. The dielectric layer 1602 that was deposited over the the recessed high voltage metal oxide semiconductor layer can be etched, and a metal 1604 deposited such that it makes electrical contact with the source or drain 1606.

Figure 17:
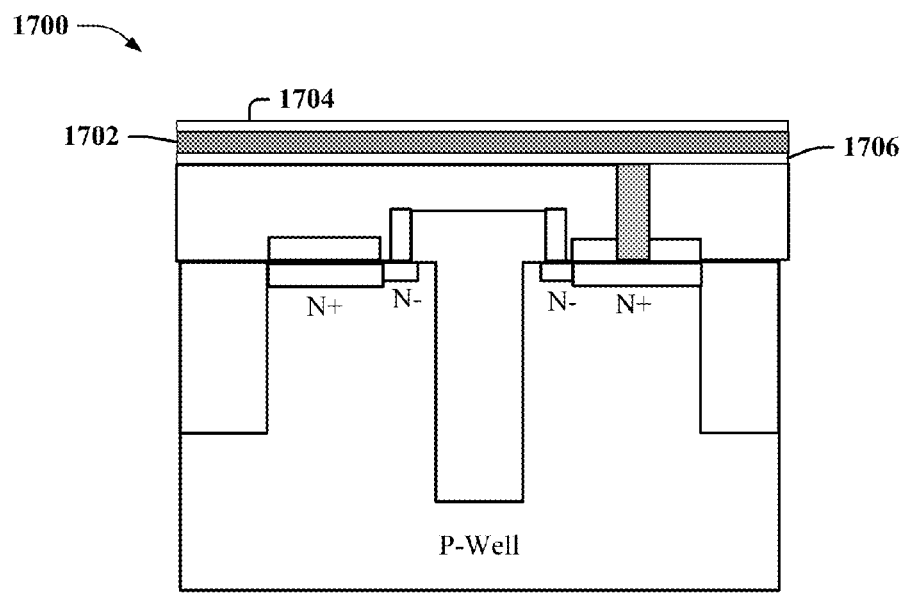
FIG. 17 illustrates a schematic diagram of a step in the fabrication process of a resistive random access memory cell connected to the recessed high voltage metal oxide semiconductor layer.

FIG. 17 illustrates a schematic diagram 1700 of a step in the fabrication process of a resistive random access memory cell connected to the recessed high voltage metal oxide semiconductor layer. A first conductive material 1702 overlying the dielectric material can be deposited. First conductive material 1702 can be a suitable metal material including alloy materials, or a semiconductor material having a suitable conductivity characteristic. The metal material can be tungsten, aluminum, copper or silver, and others. These metal materials may be deposited using a physical vapor deposition process, chemical vapor deposition process, electroplating, or electroless deposition process, among other suitable techniques, including any suitable combination(s) of these. The semiconductor material can be, for example, a suitably doped silicon material in certain embodiments. In certain embodiments, a first adhesion material 1706 is first formed overlying the dielectric material before deposition of the first conductive material 1702 to promote adhesion of the first conductive material to the first dielectric material. A diffusion barrier material 1704 may also be formed overlying the metal material to prevent the metal material from contaminating other portions of the device in a specific embodiment. In other embodiments, a diffusion barrier material 1704 may be provided between first conductive material 1702 and dielectric layer 1602. In one or more other embodiments, a seed layer or crystallization layer (not depicted) can be provided above or below first conductive material 1702, to facilitate control over density of voids, gaps, grains, material defects, etc., in a subsequent layer (e.g., near a boundary of the seed layer and the subsequent layer, or throughout the subsequent layer, depending on the embodiment). Further, one or more contact layers can be provided above or below first conductive layer 1702, in additional embodiments, to promote good electrical contact (e.g., ohmic contact) between one or more other layers. In another embodiment, a buffer layer comprising one or more doped silicon layers can be disposed overlying or underlying first conductive layer 1702. In at least one embodiment, a combination of the foregoing layers can be provided in a suitable arrangement known to one of skill in the art or made known to one of such skill by way of the context provided herein, and such combination is considered to be within the scope of the present disclosure.

Figure 18:
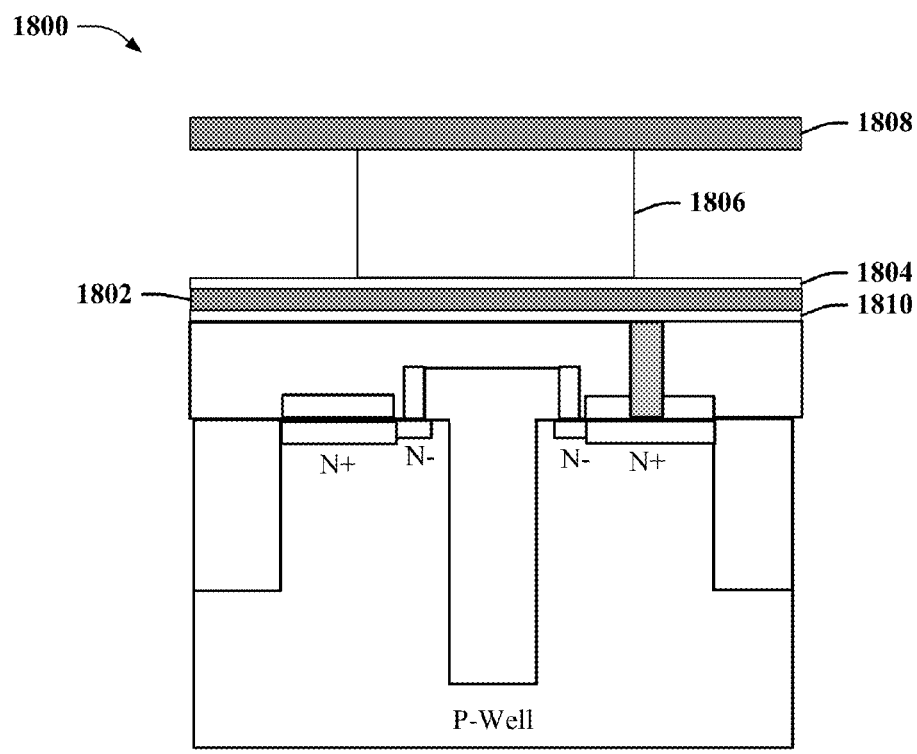
FIG. 18 illustrates a schematic diagram of a step in the fabrication process of a resistive random access memory cell connected to the recessed high voltage metal oxide semiconductor layer.

FIG. 18 illustrates a schematic diagram of a step in the fabrication process of a resistive random access memory cell connected to the recessed high voltage metal oxide semiconductor layer. A resistive switching device 1800 for a resistive random access memory cell is provided as shown in FIG. 18. It should be appreciated that the resistive switching device is not drawn to scale with respect to the recessed high voltage metal oxide semiconductor transistor depicted below (and electrically connected to) resistive switching device 1800. The resistive switching device 1800 includes a first electrode 1802 formed from the first wiring material, a second electrode 1808, and a resistive switching material 1806 configured in an intersection region between the first electrode 1802 and the second electrode 1808. Second electrode 1808 includes at least an active conductive material, and the resistive switching material is configured to be in electrical contact (and physical contact, in some embodiments) with the active conductive material. In alternative or additional embodiments, one or more additional material layers 1804 overlying the first electrode 1802 can be provided, such as an adhesion layer, diffusion barrier layer, seed/crystallization layer, contact layer, buffer layer, etc., or a suitable combination thereof. Likewise, in at least some additional embodiments, one or more further layers 1810 underlying the first electrode 1802 can be provided, including a any suitable one of the foregoing layers or a suitable combination thereof. Depending on the application, the first electrode and the second electrode can each include a wring structure using metal material selected from silver, copper, tungsten, aluminum, or a combination. In other embodiments, the wiring structure for each of the first electrode and the second electrode can be a doped semiconductor material.

Referring to FIG. 18, resistive switching material 1806 can include a silicon material having an intrinsic semiconductor characteristic. In a specific embodiment, the silicon material can be an amorphous silicon material or an amorphous silicon germanium material having an intrinsic semiconductor characteristic. In other embodiments, resistive switching material 1806 can include a metal oxide material such as a zinc oxide material.

The aforementioned diagrams have been described with respect to interaction between several components of a memory cell, or memory architectures comprised of such memory cells. It should be appreciated that in some suitable alternative aspects of the subject disclosure, such diagrams can include those components and architectures specified therein, some of the specified components/architectures, or additional components/architectures. Sub-components can also be implemented as electrically connected to other sub-components rather than included within a parent architecture. Additionally, it is noted that one or more disclosed processes can be combined into a single process providing aggregate functionality. For instance, a read process or a write process can comprise an inhibit process, or the like, or vice versa, to facilitate selective reading or writing to subsets of memory cells on a common line. Components of the disclosed architectures can also interact with one or more other components not specifically described herein but known by those of skill in the art.

Figure 19:
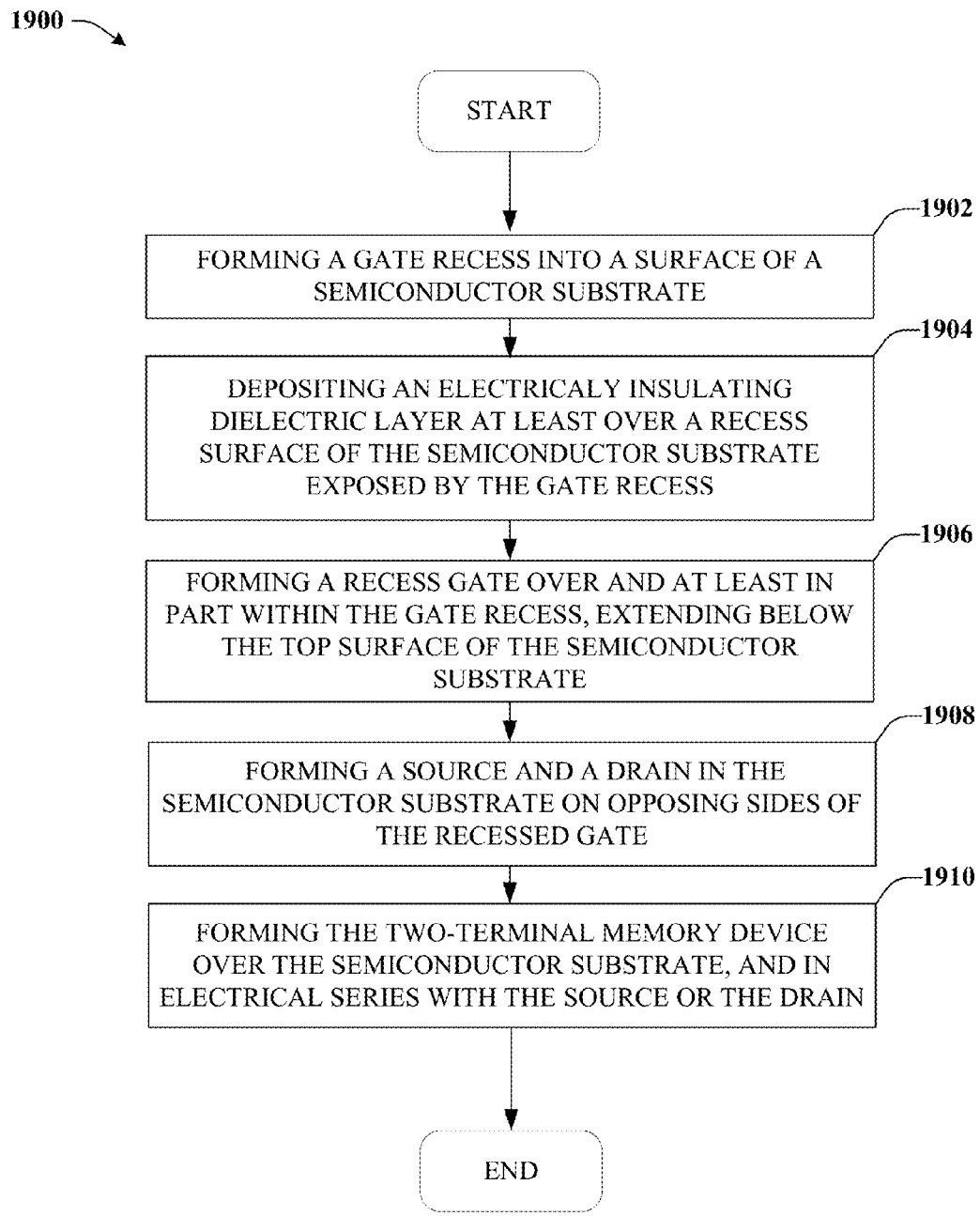
FIG. 19 illustrates a flowchart of an example method for fabricating a recessed high voltage metal oxide semiconductor transistor according to one or more embodiments disclosed herein.

In view of the exemplary diagrams described supra, process methods that can be implemented in accordance with the disclosed subject matter will be better appreciated with reference to the flow chart of FIG. 19. While for purposes of simplicity of explanation, the methods of FIG. 19 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any suitable computer-readable device, device in conjunction with a carrier, storage medium, or the like, or a suitable combination thereof.

Turning now to FIG. 19, a flowchart of an example method for operating a non-volatile memory cell with a volatile element according to one or more embodiments disclosed herein is illustrated. Flowchart 1900 can begin at 1902 where a gate recess is formed into a surface of a semiconductor substrate. The recess can be formed via etching the semiconductor substrate, and the depth of the recess can be 0.17 µm, while the width can be 0.055 µm.

At 1904, the method can include depositing an electrically insulating dielectric layer at least over a recess surface of the semiconductor substrate exposed by the gate recess. The dielectric can be a gate oxide layer formed from $SiO_2$ or $HfO_2$ that is either oxidized or deposited at high temperature. The thickness of the dielectric layer can be between 3 nm and 7 nm.

At 1906, the method can include forming a recess gate over and at least in part within the gate recess, extending below the top surface of the semiconductor substrate and at 1908, the method can include forming a source and a drain in the semiconductor substrate with the recessed gate between the source and the drain. The source and the drain can be formed from ions implanted into the semiconductor substrate and can include either arsenic or phosphorous ions for NMOS type transistors or boron ions for PMOS type transistors. Forming the source and the drain on other side of the recess. The inversion layer or channel path must go around the bottom of the recess, lengthening the channel length without a corresponding increase in the size of the transistor. At 1910, the method can include forming the two-terminal memory device over the semiconductor substrate and in electrical series with the source or the drain.

In a further embodiment, method 1900 can further comprise forming the source and the drain from a positive n-channel ion implantation into the semiconductor substrate such as arsenic or boron. In other embodiments, the source and drain can be formed from positive p-channel ions implanted into the semiconductor substrate such as boron. The method can further comprise forming a negative n-channel region within the semiconductor substrate and between the positive n-channel source and the recess gate, or between the positive n-channel drain and the recess gate or forming a negative p-channel region within the substrate and between the positive p-channel source or the positive p-channel drain and the recess gate. In other embodiments, the method 1500 can include selecting a material for the recess gate from a group of materials consisting of polysilicon, TaN, TiN, and silicide.

Example Operating Environments

In various embodiments of the subject disclosure, disclosed memory architectures can be employed as a stand-alone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact flash (CF) card, or the like, or suitable combinations of the foregoing. (See, e.g., FIGS. 20 and 21, infra).

NAND FLASH is employed for compact FLASH devices, USB devices, SD cards, solid state drives (SSDs), and storage class memory, as well as other form-factors. Although NAND has proven a successful technology in fueling the drive to scale down to smaller devices and higher chip densities over the past decade, as technology scaled down past 25 nanometer (nm) memory cell technology, the inventors have identified several structural, performance, and reliability problems that became evident to them. These or similar considerations can be addressed by some or all of the disclosed aspects.

Figure 20:
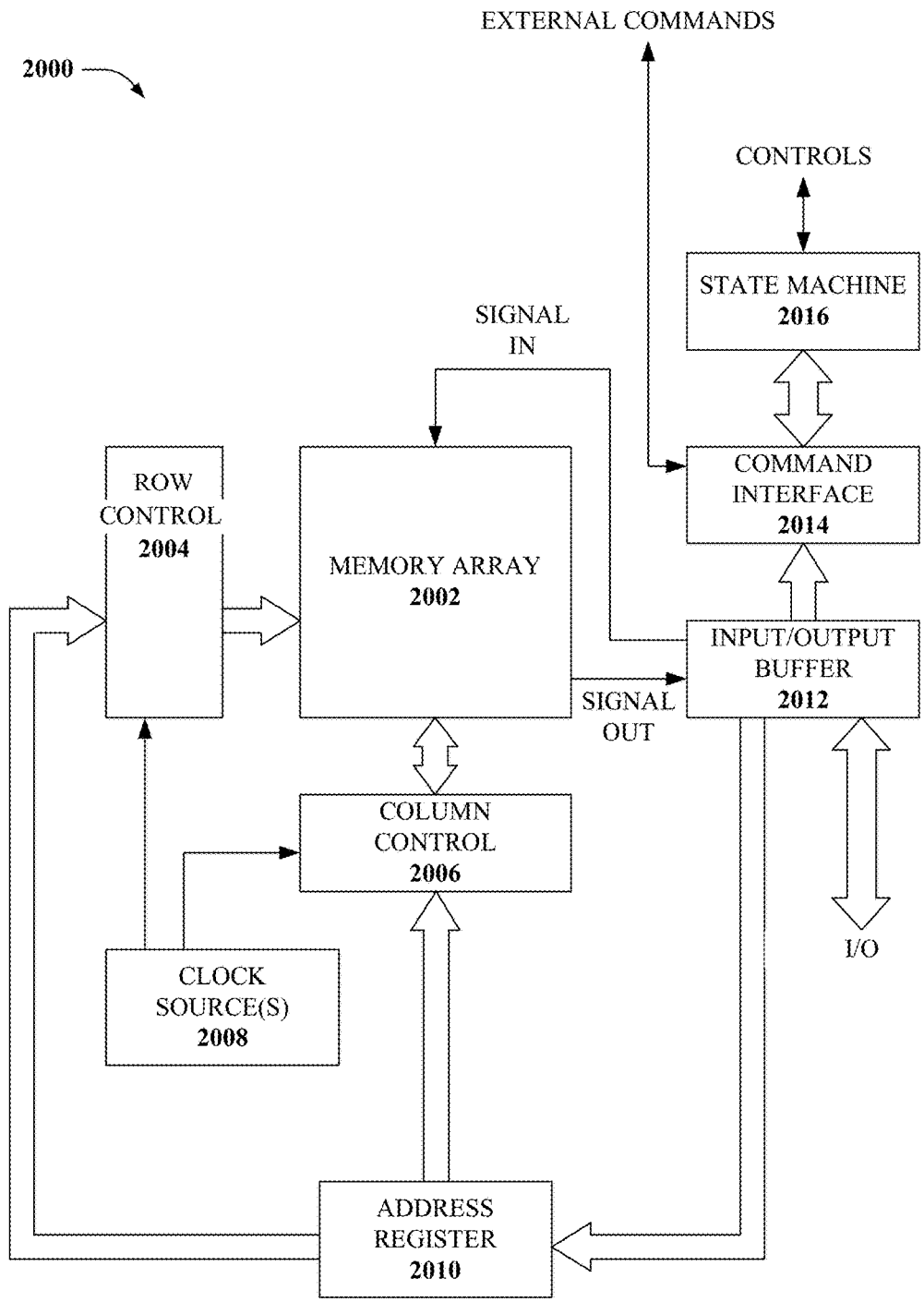
FIG. 20 depicts a block diagram of a sample operating environment for facilitating implementation of one or more aspects disclosed herein.

In order to provide a context for the various aspects of the disclosed subject matter, FIG. 20, as well as the following discussion, is intended to provide a brief, general description of a suitable environment in which various aspects of the disclosed subject matter can be implemented or processed. While the subject matter has been described above in the general context of electronic memory and process methods for fabricating or operating the electronic memory, those skilled in the art will recognize that the subject disclosure also can be implemented in combination with other components/layers of memory, memory architectures or process methodologies. Moreover, those skilled in the art will appreciate that the disclosed processes can be implemented within a processing system or a computer processor, either alone or in conjunction with a host computer, which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, FLASH memory module, removable memory, or the like. In a distributed computing environment, program modules can be located in both local and remote memory storage modules or devices.

FIG. 20 illustrates a block diagram of an example operating and control environment 2000 for a memory cell array 2002 according to aspects of the subject disclosure. In at least one aspect of the subject disclosure, memory cell array 2002 can comprise a variety of memory cell technology. Particularly, memory cell array 2002 can comprise two-terminal memory such as resistive memory cells with a resistive switching medium formed via ion implantation to a conductive polysilicon material, as described herein.

A column controller 2006 can be formed adjacent to memory cell array 2002. Moreover, column controller 2006 can be electrically coupled with bit lines of memory cell array 2002. Column controller 2006 can control respective bitlines, applying suitable program, erase or read voltages to selected bitlines.

In addition, operating and control environment 2000 can comprise a row controller 2004. Row controller 2004 can be formed adjacent to column controller 2006, and electrically connected with word lines of memory cell array 2002. Row controller 2004 can select particular rows of memory cells with a suitable selection voltage. Moreover, row controller 2004 can facilitate program, erase or read operations by applying suitable voltages at selected word lines.

A clock source(s) 2008 can provide respective clock pulses to facilitate timing for read, write, and program operations of row control 2004 and column control 2006. Clock source(s) 2008 can further facilitate selection of word lines or bit lines in response to external or internal commands received by operating and control environment 2000. An input/output buffer 2012 can be connected to an external host apparatus, such as a computer or other processing device (not depicted) by way of an I/O buffer or other I/O communication interface. Input/output buffer 2012 can be configured to receive write data, receive an erase instruction, output readout data, and receive address data and command data, as well as address data for respective instructions. Address data can be transferred to row controller 2004 and column controller 2006 by an address register 2010. In addition, input data is transmitted to memory cell array 2002 via signal input lines, and output data is received from memory cell array 2002 via signal output lines. Input data can be received from the host apparatus, and output data can be delivered to the host apparatus via the I/O buffer.

Commands received from the host apparatus can be provided to a command interface 2014. Command interface 2014 can be configured to receive external control signals from the host apparatus, and determine whether data input to the input/output buffer 2012 is write data, a command, or an address. Input commands can be transferred to a state machine 2016.

State machine 2016 can be configured to manage programming and reprogramming of memory cell array 2002. State machine 2016 receives commands from the host apparatus via input/output interface 2012 and command interface 2014, and manages read, write, erase, data input, data output, and like functionality associated with memory cell array 2002. In some aspects, state machine 2016 can send and receive acknowledgments and negative acknowledgments regarding successful receipt or execution of various commands.

To implement read, write, erase, input, output, etc., functionality, state machine 2016 can control clock source(s) 2008. Control of clock source(s) 2008 can cause output pulses configured to facilitate row controller 2004 and column controller 2006 implementing the particular functionality. Output pulses can be transferred to selected bit lines by column controller 2006, for instance, or word lines by row controller 2004, for instance.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more respective components are fabricated or implemented on separate IC chips.

In connection with FIG. 21, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 21:
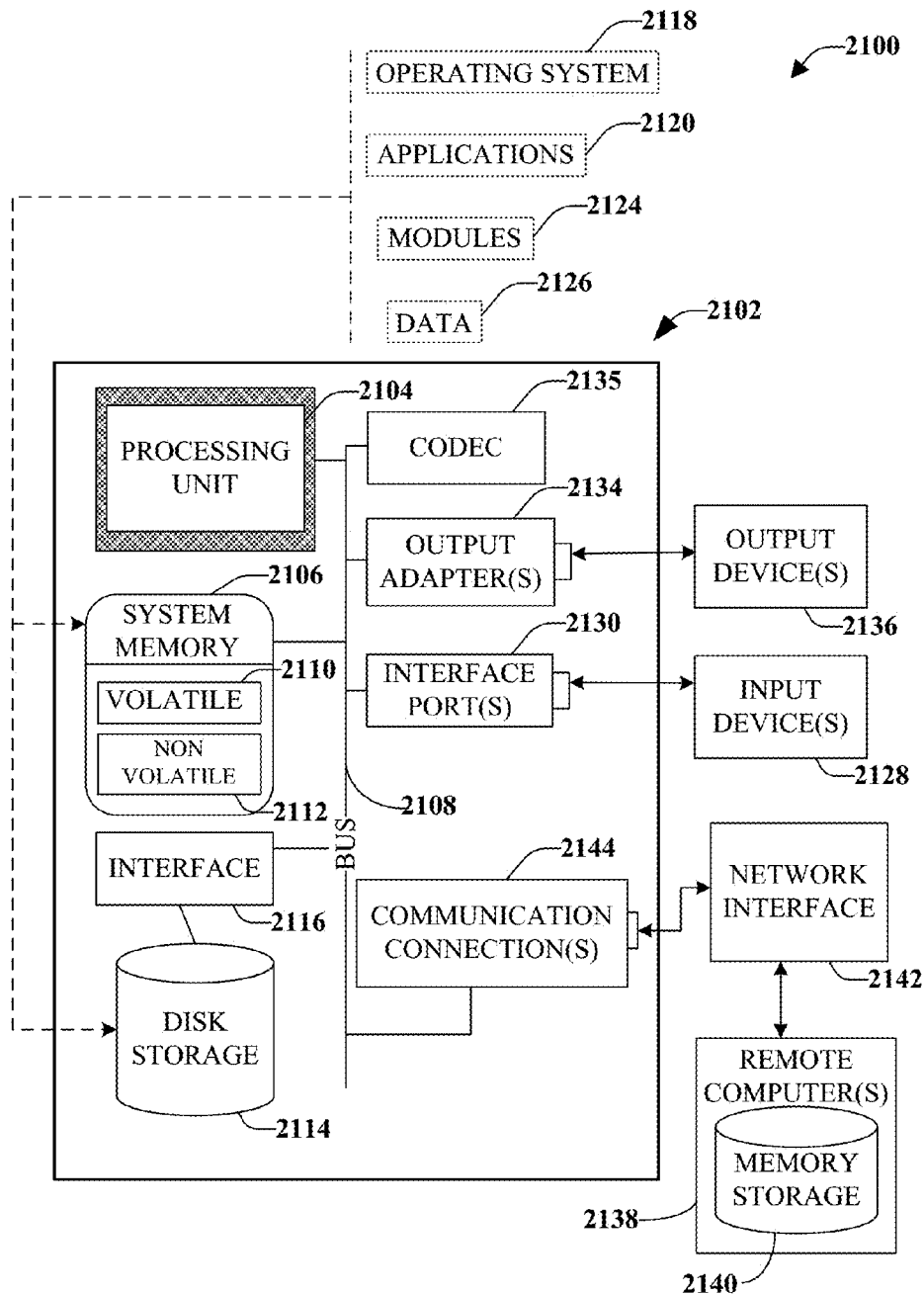
FIG. 21 illustrates a block diagram of an example computing environment that can be implemented in conjunction with various embodiments.

With reference to FIG. 21, a suitable environment 2100 for implementing various aspects of the claimed subject matter includes a computer 2102. The computer 2102 includes a processing unit 2104, a system memory 2106, a codec 2135, and a system bus 2108. The system bus 2108 couples system components including, but not limited to, the system memory 2106 to the processing unit 2104. The processing unit 2104 can be any of various available processors. Dual microprocessors and other multiprocessor architectures also can be employed as the processing unit 2104.

The system bus 2108 can be any of several types of bus structure(s) including the memory bus or memory controller, a peripheral bus or external bus, or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 2106 includes volatile memory 2110 and non-volatile memory 2112, which can employ one or more of the disclosed memory architectures, in various embodiments. The basic input/output system (BIOS), containing the basic routines to transfer information between elements within the computer 2102, such as during start-up, is stored in non-volatile memory 2112. In addition, according to present innovations, codec 2135 may include at least one of an encoder or decoder, wherein the at least one of an encoder or decoder may consist of hardware, software, or a combination of hardware and software. Although, codec 2135 is depicted as a separate component, codec 2135 may be contained within non-volatile memory 2112. By way of illustration, and not limitation, non-volatile memory 2112 can include read only memory (ROM), programmable ROM (PROM), electrically programmable ROM (EPROM), electrically erasable programmable ROM (EEPROM), or Flash memory. Non-volatile memory 2112 can employ one or more of the disclosed memory devices, in at least some embodiments. Moreover, non-volatile memory 2112 can be computer memory (e.g., physically integrated with computer 2102 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 2110 includes random access memory (RAM), which acts as external cache memory, and can also employ one or more disclosed memory devices in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM) and so forth.

Computer 2102 may also include removable/non-removable, volatile/non-volatile computer storage medium. FIG. 21 illustrates, for example, disk storage 2114. Disk storage 2114 includes, but is not limited to, devices like a magnetic disk drive, solid state disk (SSD) floppy disk drive, tape drive, Jaz drive, Zip drive, LS-100 drive, flash memory card, or memory stick. In addition, disk storage 2114 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 2114 to the system bus 2108, a removable or non-removable interface is typically used, such as interface 2116. It is appreciated that storage devices 2114 can store information related to a user. Such information might be stored at or provided to a server or to an application running on a user device. In one embodiment, the user can be notified (e.g., by way of output device(s) 2136) of the types of information that are stored to disk storage 2114 or transmitted to the server or application. The user can be provided the opportunity to opt-in or opt-out of having such information collected or shared with the server or application (e.g., by way of input from input device(s) 2128).

It is to be appreciated that FIG. 21 describes software that acts as an intermediary between users and the basic computer resources described in the suitable operating environment 2100. Such software includes an operating system 2118. Operating system 2118, which can be stored on disk storage 2114, acts to control and allocate resources of the computer system 2102. Applications 2120 take advantage of the management of resources by operating system 2118 through program modules 2124, and program data 2126, such as the boot/shutdown transaction table and the like, stored either in system memory 2106 or on disk storage 2114. It is to be appreciated that the claimed subject matter can be implemented with various operating systems or combinations of operating systems.

A user enters commands or information into the computer 2102 through input device(s) 2128. Input devices 2128 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 2104 through the system bus 2108 via interface port(s) 2130. Interface port(s) 2130 include, for example, a serial port, a parallel port, a game port, and a universal serial bus (USB). Output device(s) 2136 use some of the same type of ports as input device(s) 2128. Thus, for example, a USB port may be used to provide input to computer 2102 and to output information from computer 2102 to an output device 2136. Output adapter 2134 is provided to illustrate that there are some output devices 2136 like monitors, speakers, and printers, among other output devices 2136, which require special adapters. The output adapters 2134 include, by way of illustration and not limitation, video and sound cards that provide a means of connection between the output device 2136 and the system bus 2108. It should be noted that other devices or systems of devices provide both input and output capabilities such as remote computer(s) 2138.

Computer 2102 can operate in a networked environment using logical connections to one or more remote computers, such as remote computer(s) 2138. The remote computer(s) 2138 can be a personal computer, a server, a router, a network PC, a workstation, a microprocessor based appliance, a peer device, a smart phone, a tablet, or other network node, and typically includes many of the elements described relative to computer 2102. For purposes of brevity, only a memory storage device 2140 is illustrated with remote computer(s) 2138. Remote computer(s) 2138 is logically connected to computer 2102 through a network interface 2142 and then connected via communication connection(s) 2144. Network interface 2142 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 2144 refers to the hardware/software employed to connect the network interface 2142 to the bus 2108. While communication connection 2144 is shown for illustrative clarity inside computer 2102, it can also be external to computer 2102. The hardware/software necessary for connection to the network interface 2142 includes, for exemplary purposes only, internal and external technologies such as, modems including regular telephone grade modems, cable modems and DSL modems, ISDN adapters, and wired and wireless Ethernet cards, hubs, and routers.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A memory recessed MOS transistor device, comprising:
  a resistive switching device;
  a recessed MOS transistor device comprising:
    a semiconductor substrate;
    a gate formed at least in part in a recess in a top surface of the semiconductor substrate and having a feature size in a direction parallel to the top surface of the semiconductor substrate that is less than about 100 nm;
    a dielectric material between the gate and the semiconductor substrate; and
    a source region on a first side of the gate and a drain region on an opposing side of the gate, wherein at least one of the source region and drain region is connected to the resistive switching device, and wherein the recessed MOS transistor device and the resistive switching device form a 1T-1R memory device and
    wherein the recessed MOS transistor device has a channel length, characterized by a length of a conductive path between the source region and the drain region, that is a function of the feature size and a depth of the recess and is less than or equal to about 430 nanometers (nm), and wherein the recessed MOS transistor device is a high voltage transistor device that is configured to maintain a deactivated state in response to a voltage between the source region and the drain region that is greater than three volts.

2. The memory recessed MOS transistor device of claim 1, wherein the source region and the drain region comprise respective first regions having a first concentration of n-type semiconductor material.

3. The memory recessed MOS transistor device of claim 2, wherein the source region and the drain region further comprise respective second regions, adjacent the respective first regions, having a second concentration of n-type semiconductor material heavier than the first concentration.

4. The memory recessed MOS transistor device of claim 1, wherein the semiconductor substrate is an n-type semiconductor material and the source region and the drain region comprise respective first regions having a first concentration of p-type semiconductor material.

5. The memory recessed MOS transistor device of claim 4, wherein the source region and the drain region further comprise respective second regions, adjacent the respective first regions, having a second concentration of p-type semiconductor material, wherein the second concentration is heavier than the first concentration.

6. The memory recessed MOS transistor device of claim 1, wherein the depth of the recess is between about 0.05 μm and about 0.2 μm, a width of the recess is between about 15 nm and about 130 nm, and the channel length is greater than about 0.35 μm.

7. The memory recessed MOS transistor device of claim 1, wherein the dielectric material has a thickness between about 3 nm and about 7 nm, and is selected from a group consisting of SiO2 and HfO2.

8. The memory recessed MOS transistor device of claim 1, wherein the source region and the drain region comprise at least one of arsenic ions or boron ions implanted into the semiconductor substrate to a depth of up to about 0.2 μm, wherein the arsenic ions are associated with n-channel type material and boron ions are associated with p-channel type material.

9. A memory cell, comprising:
  a two-terminal resistive switching device; and
  a MOS transistor device serially connected to the two-terminal resistive switching device, wherein the MOS transistor further comprises:
    a semiconductor substrate;
    a gate formed into a recess in the semiconductor substrate and having a feature size in a direction parallel to a top surface of the semiconductor substrate that is no greater than about 100 nm, wherein the MOS transistor device is a high voltage transistor device configured to maintain a deactivated state in response to a voltage between the source element and the drain element that is greater than about three volts and further configured to have a channel length, characterized by a length of a conductive path between the source element and the drain element that is a function of the feature size and a depth of the recess, that is greater than 100 nm and less than or equal to about 430 nm;
    a dielectric material between the gate and the semiconductor substrate;
    the source element region and the drain element region are located on opposing sides of the gate, wherein at least one of the source element and drain element are connected to the two-terminal resistive switching device to form a one transistor-one resistor (1T-1R) memory device.

10. The memory cell of claim 9, wherein a depth of the recess is between about 0.05 μm and about 0.17 μm, a width of the recess is between about 15 nm and about 130 nm, and the channel length is about 0.35 μm.

11. The memory cell of claim 9,
  wherein the source element and the drain element comprise respective first regions having a first concentration of n-type semiconductor material; and
  wherein the source element and the drain element comprise respective second regions, adjacent the respective first regions, having a second concentration of n-type semiconductor material heavier than the first concentration.

12. The memory cell of claim 11, wherein the two-terminal resistive switching device is selected from a group consisting of: ferroelectric RAM, magneto-resistive RAM, organic RAM, phase change RAM, and conductive bridging RAM.

13. The memory cell of claim 9, wherein the two-terminal resistive switching device comprises a non-stoichiometric resistive switching layer selected from a group consisting of: SiOx, SiOxNy, SiNx, HfOx, TiOx, Al2Ox, and TaOx.

14. The memory cell of claim 9,
  wherein the semiconductor material is an n-type semiconductor material and the source element and the drain element comprise respective first regions having a first concentration of p-type semiconductor material; and
  wherein the source element and the drain element further comprise respective second regions, adjacent the respective first regions, having a second concentration of p-type semiconductor material heavier than the first concentration.

15. The memory cell of claim 9, wherein the two-terminal resistive switching devices comprises a non-stoichiometric active metal layer selected from a group consisting of: a non-stoichiometric metal alloy, a non-stoichiometric metal compound, and a non-stoichiometric metal nitride.

16. The memory cell of claim 9, wherein the source element and the drain element comprise at least one of arsenic ions or boron ions implanted into the semiconductor substrate to a depth of up to about 0.2 μm, wherein the arsenic ions are associated with n-channel type material and boron ions are associated with p-channel type material.

17. A method of fabricating a memory device comprising a recessed MOS transistor device, comprising:
  providing a semiconductor substrate;
  forming a recess in a top surface of the semiconductor substrate;
  forming a source region and a drain region respectively on opposing sides of the recess;
  forming a dielectric material overlying the source region, the drain region and the recess;
  forming a gate overlying and in part within the recess and a portion of the dielectric material, the gate having a feature size in a direction parallel to the top surface of the semiconductor substrate that is about 100 nm or less;
  forming a two-terminal resistive switching memory device overlying the semiconductor substrate; and
  connecting a first terminal of the two-terminal resistive switching memory device to the source region or to the drain region forming a 1T-1R memory device, wherein:
    forming the source region and the drain region further comprises creating a channel length, characterized by a length of a conductive path between the source region and the drain region that is a function of the feature size and a depth of the recess and is less than or equal to about 430 nm, and the source region and the drain region are configured to maintain a non-conductive deactivated state for the recessed MOS transistor in response to a voltage between the source region and the drain region that is at least three volts.

18. The method of claim 17, further comprising:

doping respective first regions of the source region and the drain region to have a first concentration of n-type semiconductor material; and doping respective second regions of the source region and the drain region, located adjacent to the respective first regions, to have a second concentration of n-type semiconductor material heavier than the first concentration.

19. The memory recessed MOS transistor device of claim 1, wherein the resistive switching device is selected from a group consisting of: ferroelectric RAM, magneto-resistive RAM, organic RAM, phase change RAM, and conductive bridging RAM.

20. The method of claim 1, wherein the resistive switching device comprises a non-stoichiometric resistive switching layer selected from a group consisting of: SiOx, SiOxNy, SiNx, HfOx, TiOx, Al2Ox and TaOx.

21. The method of claim 1, wherein the resistive switching device comprises an active material layer selected from a group consisting of: a non-stoichiometric metal alloy, a non-stoichiometric metal compound, and non-stoichiometric metal nitride.

* * * * *